US012660446B2

(12) United States Patent
Jeon et al.

(10) Patent No.: US 12,660,446 B2
(45) Date of Patent: Jun. 16, 2026

(54) DISPLAY DEVICE

(71) Applicant: Samsung Display Co., Ltd., Yongin-si (KR)

(72) Inventors: Yujin Jeon, Yongin-si (KR); Wonse Lee, Yongin-si (KR); Donghyeon Jang, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 459 days.

(21) Appl. No.: 18/317,813

(22) Filed: May 15, 2023

(65) Prior Publication Data

US 2023/0371328 A1 Nov. 16, 2023

(30) Foreign Application Priority Data

May 16, 2022 (KR) ......................... 10-2022-0059829
Dec. 16, 2022 (KR) ......................... 10-2022-0177539

(51) Int. Cl.
*H10K 59/131* (2023.01)
*H10K 59/121* (2023.01)

(52) U.S. Cl.
CPC ....... *H10K 59/131* (2023.02); *H10K 59/1213* (2023.02)

(58) Field of Classification Search
CPC ............. H10K 59/131; H10K 59/1213; H10K 59/123; H10K 59/80515; H10K 59/121; H10K 59/12; H10K 59/1315; H10K 59/60; H10K 59/65; H10K 59/82; H10K 59/8051–80518
See application file for complete search history.

(56) References Cited

U.S. PATENT DOCUMENTS

| | | | |
|---|---|---|---|
| 7,414,599 B2 | 8/2008 | Chung et al. | |
| 11,711,958 B2 * | 7/2023 | Sun ...................... | H10K 59/352 |
| 2012/0176299 A1 * | 7/2012 | Kang ................... | G09G 3/3225 |
| | | | 345/82 |
| 2015/0379930 A1 * | 12/2015 | Lee ...................... | G09G 3/3233 |
| | | | 345/76 |
| 2019/0006521 A1 * | 1/2019 | Noh ................... | H10D 30/6713 |

(Continued)

FOREIGN PATENT DOCUMENTS

| | | | | |
|---|---|---|---|---|
| CN | 111009195 A | 4/2020 | | |
| CN | 112038373 A | * 12/2020 | ............. | H10K 59/12 |

(Continued)

*Primary Examiner* — Chad M Dicke
*Assistant Examiner* — Gary Abel
(74) *Attorney, Agent, or Firm* — Womble Bond Dickinson (US) LLP

(57) ABSTRACT

A display device includes: a substrate including: a first area; a second area at least partially surrounding the first area; and a third area at least partially surrounding the second area; first display elements at the first area, each of the first display elements including a first pixel electrode; second display elements at the first area, each of the second display elements including a second pixel electrode; third display elements at the first area, each of the third display elements including a third pixel electrode; and a first connection line electrically connecting the first display elements to each other. The first connection line overlaps with at least a portion of the second pixel electrode, and at least a portion of the third pixel electrode.

20 Claims, 14 Drawing Sheets

(56)                 References Cited

U.S. PATENT DOCUMENTS

2021/0296420 A1*   9/2021   Bok ..................... H10K 59/121
2022/0149324 A1*   5/2022   Park .................. H10K 59/8731
2022/0199702 A1*   6/2022   Park ....................... H10K 50/86
2022/0310743 A1*   9/2022   Yi ........................ H10K 59/123
2024/0074268 A1*   2/2024   Huang .................. H10K 59/35

FOREIGN PATENT DOCUMENTS

CN         212230433   U     12/2020
CN         113178537   A      7/2021
CN         113948562   A   *   1/2022   ............. H10K 59/65
KR      10-0560780   B1    3/2006
KR   10-2021-0113537   A      9/2021

* cited by examiner

DISPLAY DEVICE

CROSS-REFERENCE TO RELATED APPLICATIONS

This application claims priority to and the benefit of Korean Patent Application No. 10-2022-0059829, filed on May 16, 2022, and Korean Patent Application No. 10-2022-0177539, filed on Dec. 16, 2022, in the Korean Intellectual Property Office, the entire disclosures of all of which are incorporated by reference herein.

BACKGROUND

1. Field

Aspects of one or more embodiments of the present disclosure relate to a display device.

2. Description of the Related Art

Recently, the usage of display devices has diversified. In addition, as display devices have become thinner and lighter, their range of use has gradually been extended.

As areas occupied by image display areas of display devices are expanded, various functions that are grafted or connected to the display devices have been added. As a way to add various functions, research on display devices having areas that perform various functions while displaying images is ongoing.

Areas for adding various functions while displaying images may have high transmittance to light or sound in order to perform the functions. When high transmittance is maintained in the areas for the various functions while displaying images, a resolution thereof may decrease.

The above information disclosed in this Background section is for enhancement of understanding of the background of the present disclosure, and therefore, it may contain information that does not constitute prior art.

SUMMARY

One or more embodiments of the present disclosure are directed to a display device having high transmittance.

Additional aspects and features will be set forth, in part, in the description that follows, and in part, will be apparent from the description, or may be learned by practicing one or more of the presented embodiments of the present disclosure.

According to one or more embodiments of the present disclosure, a display device includes: a substrate including: a first area; a second area at least partially surrounding the first area; and a third area at least partially surrounding the second area; first display elements at the first area, each of the first display elements including a first pixel electrode; second display elements at the first area, each of the second display elements including a second pixel electrode; third display elements at the first area, each of the third display elements including a third pixel electrode; and a first connection line electrically connecting the first display elements to each other. The first connection line overlaps with at least a portion of the second pixel electrode, and at least a portion of the third pixel electrode.

In an embodiment, the display device may further include a second connection line electrically connecting the second display elements to each other, and the second connection line may overlap with at least a portion of the first pixel electrode, and at least a portion of the third pixel electrode.

In an embodiment, the display device may further include a third connection line electrically connecting the third display elements to each other, and the third connection line may overlap with at least a portion of the first pixel electrode, and at least a portion of the second pixel electrode.

In an embodiment, an overall shape of the first connection line, the second connection line, and the third connection line in a plan view may be x-shaped.

In an embodiment, at least a portion of the first connection line and at least a portion of the second connection line may be parallel to each other.

In an embodiment, at least a portion of the first connection line and at least a portion of the third connection line may be parallel to each other.

In an embodiment, the first connection line, the second connection line, and the third connection line may be located at a same layer as each other.

In an embodiment, the first connection line may electrically connect two first display elements from among the first display elements to each other, and the second connection line may electrically connect two second display elements from among the second display elements to each other.

In an embodiment, the third connection line may electrically connect two third display elements from among the third display elements to each other.

In an embodiment, the third connection line may electrically connect four third display elements from among the third display elements to each other.

In an embodiment, the display device may further include: fourth display elements at the second area, each of the fourth display elements including a fourth pixel electrode; fifth display elements at the second area, each of the fifth display elements including a fifth pixel electrode; sixth display elements at the second area, each of the sixth display elements including a sixth pixel electrode; and a fourth connection line electrically connecting the fourth display elements to each other.

In an embodiment, the fourth connection line may be located at a same layer as that of the fourth pixel electrode.

In an embodiment, the display device may further include: a first pixel circuit at the second area; and a second pixel circuit at the second area.

In an embodiment, the first pixel electrode may be electrically connected to the first pixel circuit.

In an embodiment, the fourth pixel electrode may at least partially overlap with the second pixel circuit.

In an embodiment, the display device may further include: a first thin-film transistor on the substrate, and including: a first semiconductor layer including a silicon semiconductor; and a first gate electrode at least partially overlapping with the first semiconductor layer; a first interlayer insulating layer covering the first thin-film transistor; a second thin-film transistor on the first interlayer insulating layer, and including: a second semiconductor layer including an oxide semiconductor; and a second gate electrode at least partially overlapping with the second semiconductor layer; and a second interlayer insulating layer covering the second thin-film transistor.

In an embodiment, the first connection line may include an oxide semiconductor.

In an embodiment, the first connection line may be located at a same layer as that of the second semiconductor layer.

In an embodiment, the first area may include a transmissive area.

In an embodiment, the display device may further include a component overlapping with the first area.

According to one or more embodiments of the present disclosure, a display device includes: a substrate including: a first area; a second area at least partially surrounding the first area; and a third area at least partially surrounding the second area; first display elements at the first area, each of the first display elements including a first pixel electrode; first connection lines electrically connecting at least some of the first display elements to each other; second display elements at the second area, each of the second display elements including a second pixel electrode; and second connection lines electrically connecting at least some of the second display elements to each other. At least some of the first connection lines at least partially overlap with the first pixel electrode.

In an embodiment, the display device may further include: a first pixel circuit at the second area; and a second pixel circuit at the second area.

In an embodiment, the first pixel electrode may be electrically connected to the first pixel circuit.

In an embodiment, the second pixel electrode may at least partially overlap with the second pixel circuit.

In an embodiment, the second connection lines may be located at a same layer as that of the second pixel electrode.

In an embodiment, the display device may further include: a first thin-film transistor on the substrate, and including: a first semiconductor layer including a silicon semiconductor; and a first gate electrode at least partially overlapping with the first semiconductor layer; a first interlayer insulating layer covering the first thin-film transistor; a second thin-film transistor on the first interlayer insulating layer, and including: a second semiconductor layer including an oxide semiconductor; and a second gate electrode at least partially overlapping with the second semiconductor layer; and a second interlayer insulating layer covering the second thin-film transistor.

In an embodiment, the first connection lines may include an oxide semiconductor.

In an embodiment, the first connection lines may be located at a same layer as that of the second semiconductor layer.

In an embodiment, the first area may include a transmissive area.

In an embodiment, the display device may further include a component overlapping with the first area.

The above and other aspects and features of the present disclosure will be more apparent from the detailed description with reference to the drawings, and the claims and their equivalents.

BRIEF DESCRIPTION OF THE DRAWINGS

The above and other aspects and features of the present disclosure will be more clearly understood from the following detailed description of the illustrative, non-limiting embodiments with reference to the accompanying drawings, in which:

FIG. 9 is a schematic cross-sectional view illustrating a display device according to an embodiment;

FIG. 13 is a schematic cross-sectional view illustrating a display panel according to an embodiment.

DETAILED DESCRIPTION

Figure 1:
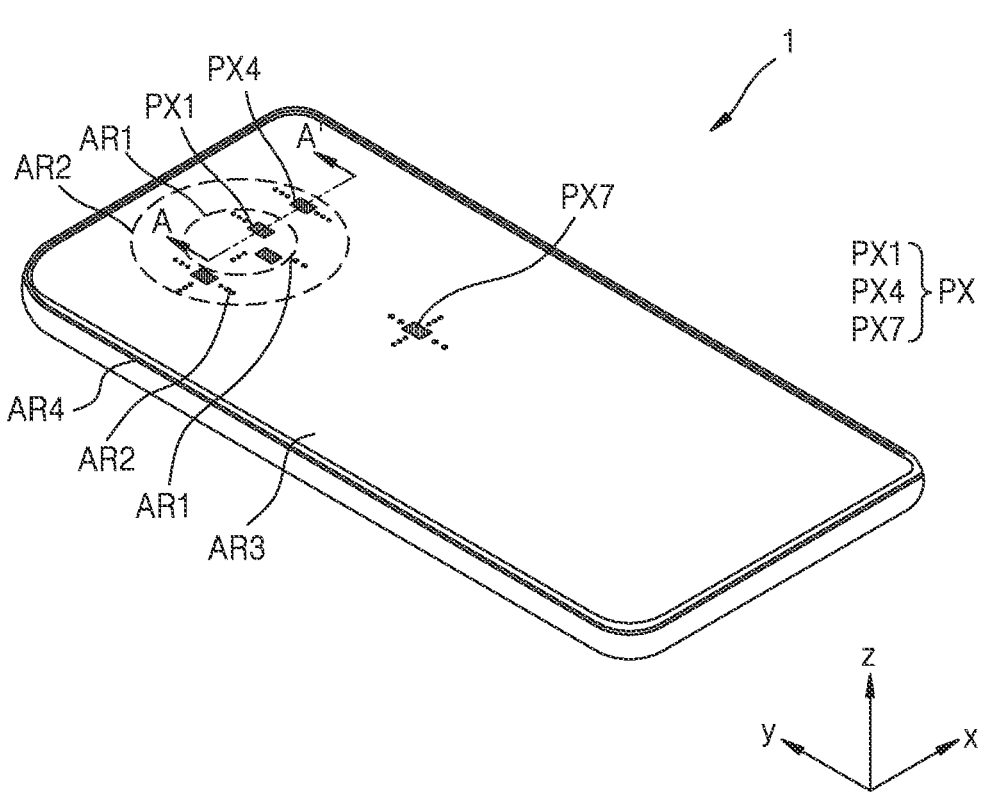
FIGS. 1 and 2 are schematic perspective views illustrating a display device according to embodiments.

Hereinafter, embodiments will be described in more detail with reference to the accompanying drawings, in which like reference numbers refer to like elements throughout. The present disclosure, however, may be embodied in various different forms, and should not be construed as being limited to only the illustrated embodiments herein. Rather, these embodiments are provided as examples so that this disclosure will be thorough and complete, and will fully convey the aspects and features of the present disclosure to those skilled in the art. Accordingly, processes, elements, and techniques that are not necessary to those having ordinary skill in the art for a complete understanding of the aspects and features of the present disclosure may not be described. Unless otherwise noted, like reference numerals denote like elements throughout the attached drawings and the written description, and thus, redundant description thereof may not be repeated.

When a certain embodiment may be implemented differently, a specific process order may be different from the described order. For example, two consecutively described processes may be performed at the same or substantially at the same time, or may be performed in an order opposite to the described order.

In the drawings, the relative sizes, thicknesses, and ratios of elements, layers, and regions may be exaggerated and/or simplified for clarity. Spatially relative terms, such as "beneath," "below," "lower," "under," "above," "upper," and the like, may be used herein for ease of explanation to describe one element or feature's relationship to another element(s) or feature(s) as illustrated in the figures. It will be understood that the spatially relative terms are intended to encompass different orientations of the device in use or in operation, in addition to the orientation depicted in the figures. For example, if the device in the figures is turned over, elements described as "below" or "beneath" or "under" other elements or features would then be oriented "above" the other elements or features. Thus, the example terms "below" and "under" can encompass both an orientation of above and below. The device may be otherwise oriented (e.g., rotated 90 degrees or at other orientations) and the spatially relative descriptors used herein should be interpreted accordingly.

In the figures, the x-axis, the y-axis, and the z-axis are not limited to three axes of the rectangular coordinate system, and may be interpreted in a broader sense. For example, the x-axis, the y-axis, and the z-axis may be perpendicular to or substantially perpendicular to one another, or may represent different directions from each other that are not perpendicular to one another.

It will be understood that, although the terms "first," "second," "third," etc., may be used herein to describe various elements, components, regions, layers and/or sections, these elements, components, regions, layers and/or sections should not be limited by these terms. These terms are used to distinguish one element, component, region, layer or section from another element, component, region, layer or section. Thus, a first element, component, region, layer or section described below could be termed a second element, component, region, layer or section, without departing from the spirit and scope of the present disclosure.

It will be understood that when an element or layer is referred to as being "on," "connected to," or "coupled to" another element or layer, it can be directly on, connected to, or coupled to the other element or layer, or one or more intervening elements or layers may be present. Similarly, when a layer, an area, or an element is referred to as being "electrically connected" to another layer, area, or element, it may be directly electrically connected to the other layer, area, or element, and/or may be indirectly electrically connected with one or more intervening layers, areas, or elements therebetween. In addition, it will also be understood that when an element or layer is referred to as being "between" two elements or layers, it can be the only element or layer between the two elements or layers, or one or more intervening elements or layers may also be present.

As used herein, the expression "a line extends in a first direction or a second direction" may include a case in which the line extends in a linear shape, as well as a case in which the line extends in a zigzag or curved shape in the first direction or the second direction, unless otherwise specifically described.

As used herein, when an element is referred to as being "on a plane," it is understood that the element is viewed from the top, such as in a plan view, and when an element is referred to as being "on a cross-section," it is understood that the element is vertically cut and viewed from the side, such as in a cross-sectional view. Further, when elements are described as "overlapping with" each other, the elements overlap with each other "on a plane" and "on a cross-section."

The terminology used herein is for the purpose of describing particular embodiments and is not intended to be limiting of the present disclosure. As used herein, the singular forms "a" and "an" are intended to include the plural forms as well, unless the context clearly indicates otherwise. It will be further understood that the terms "comprises," "comprising," "includes," "including," "has," "have," and "having," when used in this specification, specify the presence of the stated features, integers, steps, operations, elements, and/or components, but do not preclude the presence or addition of one or more other features, integers, steps, operations, elements, components, and/or groups thereof. As used herein, the term "and/or" includes any and all combinations of one or more of the associated listed items. For example, the expression "A and/or B" denotes A, B, or A and B. Expressions such as "at least one of," when preceding a list of elements, modify the entire list of elements and do not modify the individual elements of the list. For example, the expression "at least one of a, b, or c," "at least one of a, b, and c," and "at least one selected from the group consisting of a, b, and c" indicates only a, only b, only c, both a and b, both a and c, both b and c, all of a, b, and c, or variations thereof.

As used herein, the term "substantially," "about," and similar terms are used as terms of approximation and not as terms of degree, and are intended to account for the inherent variations in measured or calculated values that would be recognized by those of ordinary skill in the art. Further, the use of "may" when describing embodiments of the present disclosure refers to "one or more embodiments of the present disclosure." As used herein, the terms "use," "using," and "used" may be considered synonymous with the terms "utilize," "utilizing," and "utilized," respectively.

Unless otherwise defined, all terms (including technical and scientific terms) used herein have the same meaning as commonly understood by one of ordinary skill in the art to which the present disclosure belongs. It will be further understood that terms, such as those defined in commonly used dictionaries, should be interpreted as having a meaning that is consistent with their meaning in the context of the relevant art and/or the present specification, and should not be interpreted in an idealized or overly formal sense, unless expressly so defined herein.

Figure 2:
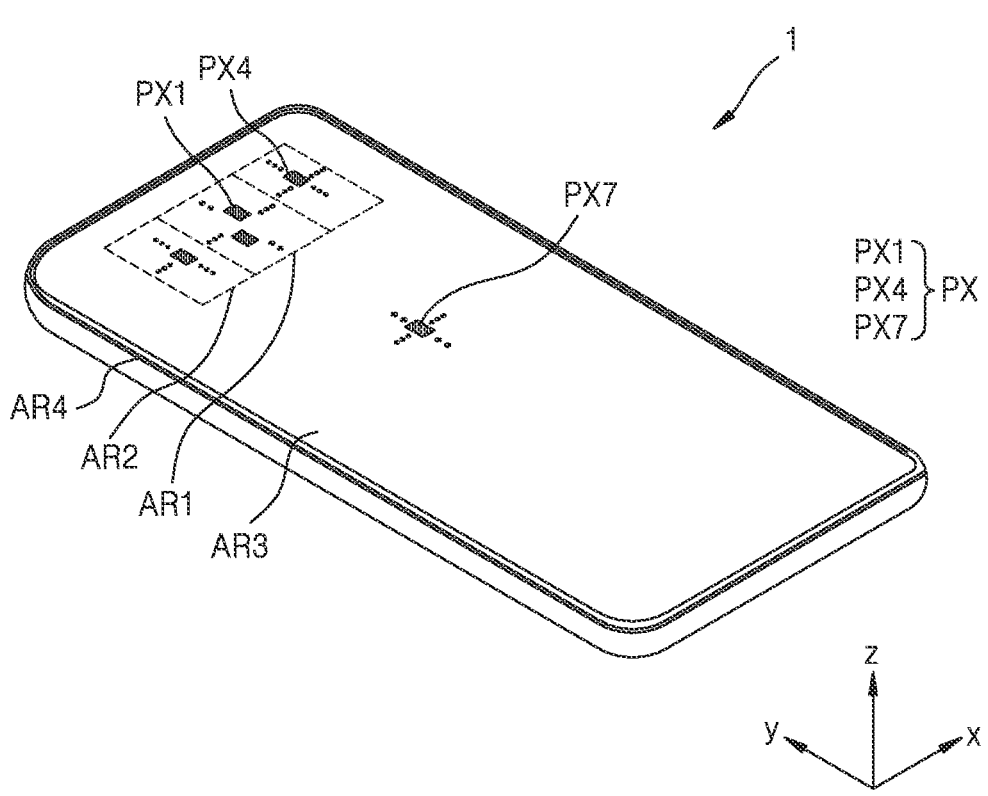

FIGS. 1 and 2 are schematic perspective views illustrating a display device 1 according to embodiments.

Referring to FIGS. 1 and 2, the display device 1 may display images. The display device 1 may include a pixel PX. The pixel PX may be defined as an area where a display element emits light. Each of the pixels PX refers to a sub-pixel, and may include a display element, such as an organic light-emitting diode. The pixel PX may emit, for example, red, green, blue, or white light.

In an embodiment, a plurality of pixels PX may be provided in the display device 1. Each of the plurality of pixels PX may emit light to display an image. In an embodiment, the pixel PX may include a first pixel PX1, a second pixel PX2 (e.g., see FIG. 10), a third pixel PX3, a fourth pixel PX4, a fifth pixel PX5 (e.g., see FIG. 12), a sixth pixel PX6, and a seventh pixel PX7. The first pixel PX1, the second pixel PX2, the third pixel PX3, the fourth pixel PX4, the fifth pixel PX5, the sixth pixel PX6, and the seventh pixel PX7 may each be provided in a plurality.

The display device 1 may include a first area AR1, a second area AR2, a third area AR3, and a fourth area AR4. The pixel PX may be arranged at (e.g., in or on) each of the first area AR1, the second area AR2, and the third area AR3. Accordingly, the first area AR1, the second area AR2, and the third area AR3 may be display areas in which images are displayed. In this case, the first pixel PX1, the second pixel PX2, and the third pixel PX3 may be arranged at (e.g., in or on) the first area AR1. The fourth pixel PX4, the fifth pixel PX5, and the sixth pixel PX6 may be arranged at (e.g., in or on) the second area AR2. The seventh pixel PX7 may be arranged at (e.g., in or on) the third area AR3. The pixel PX may not be arranged at (e.g., in or on) the fourth area AR4. Accordingly, the fourth area AR4 may be a non-display area in which an image is not displayed.

At least one of the first area AR1 or the second area AR2 may be an area overlapping with a component, and also, may be an area where the pixel PX is arranged. For example, the first area AR1 may be an area overlapping with a component, and also, may be an area where the pixel PX is arranged. As another example, both of the first area AR1 and the second area AR2 may be areas overlapping with a component, and also, may be areas where the pixels PX are arranged. In an embodiment, the first pixel PX1, the second pixel PX2, and the third pixel PX3 may be arranged at (e.g., in or on) the first area AR1. The fourth pixel PX4, the fifth pixel PX5, and the sixth pixel PX6 may be arranged at (e.g., in or on) the second area AR2. Accordingly, the first area AR1 and the second area AR2 may be areas for displaying images, and may also be areas in which components are arranged therebelow.

At least one of the first area AR1 or the second area AR2 may overlap with a component. Accordingly, in the display device 1, the first area AR1 and/or the second area AR2 may have high light transmittance or high sound transmittance. For example, the light transmittance of the display device 1 in the first area AR1 and/or the second area AR2 may be 10% or more, 25% or more, 40% or more, 50% or more, 85% or more, or 90% or more. In an embodiment, the light transmittance of the display device 1 in the first area AR1 may be higher than the light transmittance of the display device 1 in the second area AR2.

In an embodiment, at least one of the first area AR1 may be provided in the display device 1. For example, the display device 1 may include one first area AR1, or may include a plurality of first areas AR1.

In an embodiment, the second area AR2 may at least partially surround (e.g., around a periphery of) the first area AR1. For example, as shown in FIG. 1, the second area AR2 may entirely surround (e.g., around a periphery of) the first area AR1. As another example, as shown in FIG. 2, the second area AR2 may be disposed on one or more sides of the first area AR1. For example, the first area AR1 and the second area AR2 may be arranged side by side with each other along a first direction (e.g., e.g., the x direction or the −x direction). As another example, the first area AR1 and the second area AR2 may be arranged side by side with each other along a second direction (e.g., the y direction or the −y direction). In an embodiment, the second area AR2 may be disposed on opposite sides of the first area AR1.

In an embodiment, the first area AR1 and the second area AR2 may be disposed on the upper side of the display device 1. However, the present disclosure is not limited thereto. The first area AR1 and the second area AR2 may be disposed on the lower side, the right side, or the left side of the display device 1.

In an embodiment, at least one of the first area AR1 or the second area AR2 may have various suitable shapes in a plan view (e.g., an xy plane), for example, such as a polygon shape, such as a circle, an ellipse, or a quadrangle, a star shape, or a diamond shape. FIG. 1 shows that the first area AR1 and the second area AR2 each have a circular shape, and FIG. 2 shows that the first area AR1 and the second area AR2 each have a rectangular shape.

The third area AR3 may at least partially surround (e.g., around peripheries of) the first area AR1 and/or the second area AR2. In an embodiment, as shown in FIG. 1, the second area AR2 may entirely surround (e.g., around a periphery of) the first area AR1, and the third area AR3 may entirely surround (e.g., around a periphery of) the second area AR2. As another example, as shown in FIG. 2, the third area AR3 may entirely surround (e.g., around peripheries of) the first area AR1 and/or the second area AR2. The resolution of the display device 1 in the third area AR3 may be higher than or equal to the resolution of the display device 1 in the first area AR1.

The fourth area AR4 may at least partially surround (e.g., around a periphery of) the third area AR3. In an embodiment, the fourth area AR4 may entirely surround (e.g., around a periphery of) the third area AR3. As described above, the pixel PX may not be arranged at (e.g., in or on) the fourth area AR4.

Figure 3:
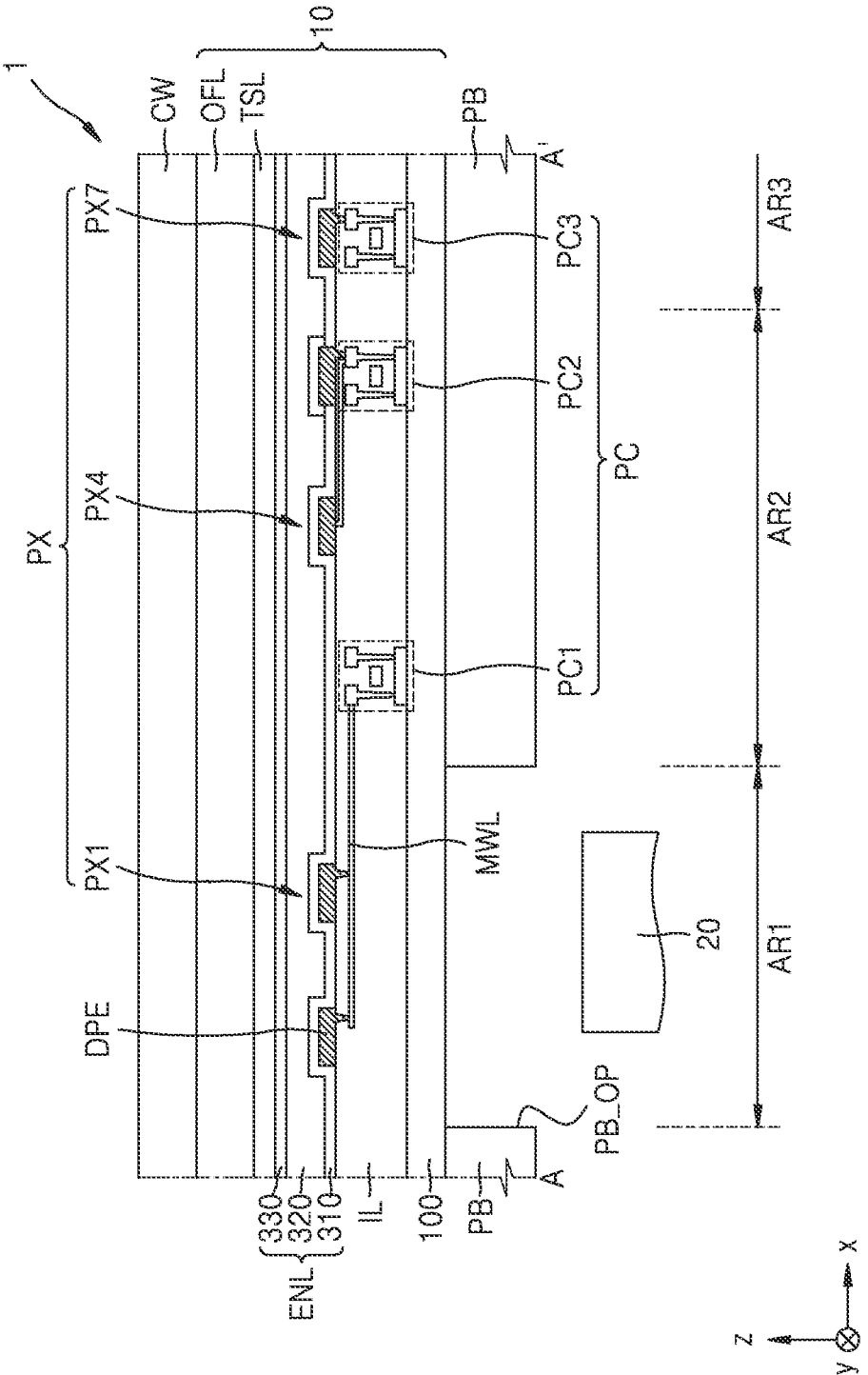
FIG. 3 is a schematic cross-sectional view illustrating a display device according to an embodiment.

FIG. 3 is a schematic cross-sectional view illustrating a display device 1 according to an embodiment. In more detail, FIG. 3 is a schematic cross-sectional view of the display device 1 taken along the line A-A' in FIG. 1.

Referring to FIG. 3, the display device 1 may include a display panel 10, a panel protecting member PB, a component 20, and a cover window CW. The display panel 10 may include a substrate 100, an insulating layer IL, a pixel circuit PC, a display element DPE, an encapsulation layer ENL, a touch sensor layer TSL, and an optical functional layer OFL.

The display device 1 may include the first area AR1, the second area AR2, and the third area AR3. In other words, because the display device 1 includes the substrate 100, the substrate 100 may include the first area AR1, the second area AR2, and the third area AR3. In other words, the first area AR1, the second area AR2, and the third area AR3 may be defined in the substrate 100. Hereinafter, a case in which the substrate 100 includes the first area AR1, the second area AR2, and the third area AR3 will be described in more detail.

The substrate 100 may include an insulating material, such as glass, quartz, or a polymer resin. The substrate 100 may be a rigid substrate, or may be a flexible substrate capable of being bent, folded, or rolled.

The insulating layer IL and the pixel circuit PC may be disposed on the substrate 100. The insulating layer IL may insulate elements of the display panel 10 from one another. The insulating layer IL may include at least one of an organic material or an inorganic material.

The pixel circuit PC may be electrically connected to the display element DPE to drive the display element DPE. The pixel circuit PC may be arranged in the insulating layer IL. In an embodiment, the pixel circuit PC may include a first pixel circuit PC1, a second pixel circuit PC2, and a third pixel circuit PC3. The first pixel circuit PC1 and the second pixel circuit PC2 may be arranged at (e.g., in or on) the second area AR2. The third pixel circuit PC3 may be arranged at (e.g., in or on) the third area AR3. In an embodiment, the pixel circuit PC may not be arranged at (e.g., in or on) the first area AR1. Therefore, the transmittance (e.g., the light transmittance) of the display panel 10 in the first area AR1 may be relatively higher than that of the display panel 10 in the second and third areas AR2 and AR3.

The display element DPE may be disposed on the insulating layer IL. In an embodiment, the display element DPE may be an organic light-emitting diode including an organic emission layer. As another example, the display element DPE may be a light-emitting diode. The size of the light-emitting diode may be in a micro scale or a nano scale. For example, the light-emitting diode may be a micro light-emitting diode. As another example, the light-emitting diode may be a nanorod light-emitting diode. The nanorod light-emitting diode may include gallium nitrogen (GaN). In an embodiment, a color conversion layer may be disposed on the nanorod light-emitting diode, and the color conversion layer may include quantum dots. As another example, the display element DPE may be a quantum dot light-emitting diode including a quantum dot emission layer. As another example, the display element DPE may be an inorganic light-emitting diode including an inorganic semiconductor. Hereinafter, for convenience, the display element DPE may be described in more detail in the context of an organic light-emitting diode, but the present disclosure is not limited thereto.

The display panel 10 may include a plurality of display elements DPE. The plurality of display elements DPE may be arranged at (e.g., in or on) the first area AR1, the second area AR2, and the third area AR3. In an embodiment, the display elements DPE may emit light, and implement a plurality of pixels PX. For example, display elements DPE arranged at (e.g., in or on) the first area AR1 may emit light, and may implement first pixels PX1. Display elements DPE arranged at (e.g., in or on) the second area AR2 may emit light, and may implement fourth pixels PX4. Display elements DPE arranged at (e.g., in or on) the third area AR3 may emit light, and may implement seventh pixels PX7. Accordingly, the display device 1 may display images in the first area AR1, the second area AR2, and the third area AR3.

In an embodiment, a plurality of display elements DPE may be electrically connected to one first pixel circuit PC1. Accordingly, a plurality of display elements DPE may emit light by using a smaller number of first pixel circuits PC1, and the transmittance of the first area AR1 may be improved.

The first pixel circuit PC1 arranged at (e.g., in or on) the second area AR2 and the display element DPE arranged at (e.g., in or on) the first area AR1 may be electrically connected to each other through an intermediate connection line MWL. The intermediate connection line MWL may extend from the second area AR2 to the first area AR1. Accordingly, the intermediate connection line MWL may be arranged at (e.g., in or on) the first area AR1 and the second area AR2.

The intermediate connection line MWL may include a transparent conductive material. For example, the intermediate connection line MWL may include a transparent conducting oxide (TCO). The intermediate connection line MWL may include a suitable conductive oxide, such as indium tin oxide (ITO), indium zinc oxide (IZO), zinc oxide (ZnO), indium oxide ($In_2O_3$), indium gallium oxide (IGO), or aluminum zinc oxide (AZO).

In an embodiment, a plurality of display elements DPE may be electrically connected to one second pixel circuit PC2. Accordingly, a plurality of display elements DPE may emit light by using a smaller number of second pixel circuits PC2.

The encapsulation layer ENL may cover the display elements DPE. In an embodiment, the encapsulation layer ENL may include at least one inorganic encapsulation layer, and at least one organic encapsulation layer. The at least one inorganic encapsulation layer may include one or more inorganic materials selected from among aluminum oxide ($Al_2O_3$), titanium oxide ($TiO_2$), tantalum oxide ($Ta_2O_5$), zinc oxide (ZnO), silicon oxide ($SiO_2$), silicon nitride ($SiN_x$), and silicon oxynitride (SiON). The at least one organic encapsulation layer may include a polymer-based material. Examples of the polymer-based material may include acrylic resin, epoxy-based resin, polyimide, and polyethylene. In an embodiment, the at least one organic encapsulation layer may include acrylate.

In an embodiment, the encapsulation layer ENL may include a first inorganic encapsulation layer 310, an organic encapsulation layer 320, and a second inorganic encapsulation layer 330, which are sequentially stacked. The first inorganic encapsulation layer 310 and the second inorganic encapsulation layer 330 may prevent or reduce penetration of foreign materials, such as moisture, into the organic encapsulation layer 320 and/or the display element DPE.

As another example, the encapsulation layer ENL may have a structure in which a sealing substrate, which is a transparent member, and the substrate 100 are coupled to (e.g., connected to or attached to) each other with a sealing member to seal an internal space between the substrate 100 and the sealing substrate. In this case, a moisture absorbent or a filler may be provided in the internal space. The sealing member may be a sealant. As another example, the sealing member may include a material cured by a laser. For example, the sealing member may be a frit. In more detail, the sealing member may include an organic sealant, such as a urethane-based resin, an epoxy-based resin, or an acrylic resin, or an inorganic sealant, such as silicone. As the urethane-based resin, urethane acrylate or the like may be used. As the acrylic resin, butyl acrylate, ethylhexyl acrylate, or the like may be used. The sealing member may include a material cured by heat.

The touch sensor layer TSL may acquire coordinate information according to an external input, for example, such as a touch event. The touch sensor layer TSL may include a touch electrode, and touch wires connected to the touch electrode. The touch sensor layer TSL may sense an external input by using a self-capacitance method or a mutual capacitance method.

The touch sensor layer TSL may be disposed on the encapsulation layer ENL. In an embodiment, the touch sensor layer TSL may be disposed directly on the encapsulation layer ENL. In this case, an adhesive layer, such as an optically transparent adhesive, may not be disposed between the touch sensor layer TSL and the encapsulation layer ENL. As another example, the touch sensor layer TSL may be separately formed on a touch substrate, and then bonded to (e.g., connected to or attached to) the encapsulation layer ENL through an adhesive layer, such as an optically transparent adhesive.

The optical functional layer OFL may include an antireflection layer. The antireflection layer may reduce a reflectance of light (e.g., external light) incident toward the display device 1 from the outside. In an embodiment, the optical functional layer OFL may be a polarizing film. As another example, the optical functional layer OFL may be provided as a filter plate including a black matrix and color filters.

The cover window CW may be disposed on the display panel 10. The cover window CW may protect the display panel 10. The cover window CW may include at least one of glass, sapphire, and plastic. The cover window CW may be, for example, ultra-thin glass (UTG), or a colorless polyimide (CPI).

The panel protecting member PB may be disposed below (e.g., underneath) the substrate 100. The panel protecting member PB may support and protect the substrate 100. In an embodiment, an opening PB_OP overlapping with the first area AR1 may be defined in (e.g., may penetrate) the panel protecting member PB. In other words, the panel protecting member PB may have the opening PB_OP overlapping with the first area AR1. In an embodiment, the opening PB_OP of the panel protecting member PB may overlap with the first area AR1 and the second area AR2. The panel protection member PB may include polyethylene terephthalate or polyimide.

The component 20 may be disposed under the display panel 10. In an embodiment, the component 20 may be disposed opposite to the cover window CW, with the display panel 10 therebetween. In an embodiment, the component 20 may overlap with the first area AR1. As another example, the component 20 may overlap with the first area AR1 and the second area AR2.

The component 20 may include (e.g., may be) a camera that uses infrared rays or visible rays, and may include an imaging device. As another example, the component 20 may include (e.g., may be) a solar cell, a flash, an illuminance sensor, a proximity sensor, or an iris sensor. As another example, the component 20 may have a function of receiving sound. In order to minimize or reduce limitations of the function of the component 20, the pixel circuit PC may not be arranged at (e.g., in or on) the first area AR1 where the component 20 is disposed thereunder. In other words, the first pixel circuit PC1 for driving the display element DPE arranged at (e.g., in or on) the first area AR1 may not be arranged at (e.g., in or on) the first area AR1, and may be arranged at (e.g., in or on) the second area AR2. Accordingly, a transmittance (e.g., a light transmittance) of the display panel 10 in the first area AR1 may be higher than a transmittance (e.g., a light transmittance) of the display panel 10 in the second area AR2.

Figure 4:
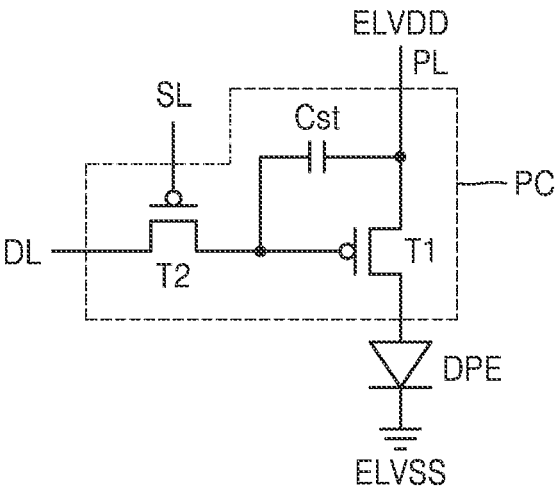
FIG. 4 is an equivalent circuit diagram of a pixel circuit electrically connected to a display element according to an embodiment.

FIG. 4 is an equivalent circuit diagram of a pixel circuit PC electrically connected to a display element DPE according to an embodiment.

Referring to FIG. 4, the pixel circuit PC may include a driving thin-film transistor T1, a switching thin-film transistor T2, and a storage capacitor Cst.

The switching thin-film transistor T2 may be electrically connected to a scan line SL and a data line DL. The switching thin-film transistor T2 may be configured to transfer a data signal (e.g., a data voltage) input from the data line DL to the driving thin-film transistor T1, based on a scan signal (e.g., a switching voltage) input from the scan line SL. The storage capacitor Cst may be electrically connected to the switching thin-film transistor T2 and a driving voltage line PL, and may store a voltage corresponding to a difference between a voltage received from the switching thin-film transistor T2 and a driving voltage ELVDD supplied to the driving voltage line PL.

The driving thin-film transistor T1 may be electrically connected to the driving voltage line PL and the storage capacitor Cst, and may be configured to control a driving current, which flows from the driving voltage line PL through the display element DPE, in response to a voltage value stored in the storage capacitor Cst. The display element DPE may emit light having a desired luminance (e.g., a certain or predetermined luminance) according to the driving current. An opposite electrode of the display element DPE may receive a common voltage ELVSS.

Although FIG. 4 shows that the pixel circuit PC includes two thin-film transistors and one storage capacitor, the pixel circuit PC may include three or more thin-film transistors.

Figure 5:
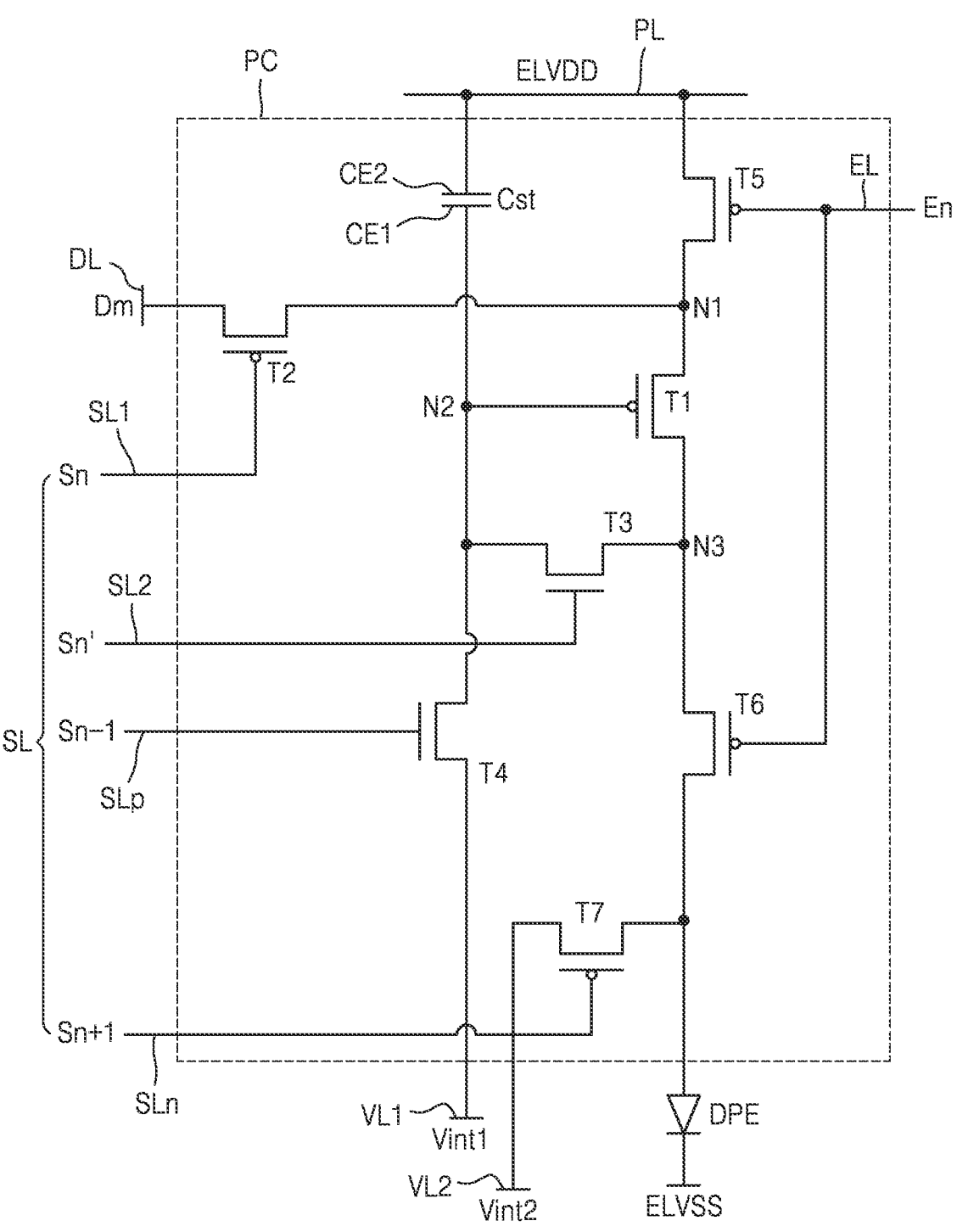
FIG. 5 is an equivalent circuit diagram of a pixel circuit electrically connected to a display element according to an embodiment.

FIG. 5 is an equivalent circuit diagram of a pixel circuit PC electrically connected to a display element DPE according to an embodiment.

Referring to FIG. 5, the pixel circuit PC may include a plurality of thin-film transistors T1 to T7, and a storage capacitor Cst. The plurality of thin-film transistors T1 to T7 and the storage capacitor Cst may be connected to signal lines SL1, SL2, SLp, SLn, EL, and DL, a first initialization voltage line VL1, a second initialization voltage line VL2, and a driving voltage line PL. At least any one of these lines, for example, such as the driving voltage line PL, may be shared by neighboring pixels (e.g., adjacent pixels).

The plurality of thin-film transistors T1 to T7 may include a driving thin-film transistor T1, a switching thin-film transistor T2, a compensation thin-film transistor T3, a first initialization thin-film transistor T4, an operation control thin-film transistor T5, an emission control thin-film transistor T6, and a second initialization thin-film transistor T7.

The display element DPE may include a first electrode (e.g., a pixel electrode) and a second electrode (e.g., an opposite electrode). The first electrode of the display element DPE may be connected to the driving thin-film transistor T1 via the emission control thin-film transistor T6 to receive a driving current. The second electrode may receive a common voltage ELVSS. The display element DPE may generate light having a desired luminance corresponding to the driving current.

Some of the thin-film transistors T1 to T7 may be n-channel metal-oxide-semiconductor field-effect-transistors (e.g., n-channel MOSFETs or NMOS transistors), and others may be p-channel MOSFETs (e.g., PMOS transistors). For example, the compensation thin-film transistor T3 and the first initialization thin-film transistor T4 from among the plurality of thin-film transistors T1 to T7 may be NMOS transistors, and the others may be PMOS transistors. As another example, the compensation thin-film transistor T3, the first initialization thin-film transistor T4, and the second initialization thin-film transistor T7 from among the plurality of thin-film transistors T1 to T7 may be NMOS transistors, and the others may be PMOS transistors. As another example, all of the thin-film transistors T1 to T7 may be NMOS transistors or PMOS transistors. Each of the plurality of thin-film transistors T1 to T7 may include amorphous silicon or polysilicon. If desired, a thin-film transistor as an NMOS transistor may include an oxide semiconductor. Hereinafter, for convenience, a case in which the compensation thin-film transistor T3 and the first initialization thin-film transistor T4 are NMOS transistors including an oxide semiconductor, and the others are PMOS transistors will be described in more detail.

The signal lines may include a first scan line SL1 configured to transmit a first scan signal Sn to the switching thin-film transistor T2, a second scan line SL2 configured to transmit a second scan signal Sn' to the compensation thin-film transistor T3, a previous scan line SLp configured to transmit a previous scan signal Sn−1 to the first initialization thin-film transistor T4, a next scan line SLn configured to transmit a next scan signal Sn+1 to the second initialization thin-film transistor T7, an emission control line EL configured to transmit an emission control signal En to the operation control thin-film transistor T5 and the emission control thin-film transistor T6, and a data line DL crossing the first scan line SL1 and configured to transmit a data signal Dm to the switching thin-film transistor T2.

The driving voltage line PL may be configured to transmit the driving voltage ELVDD to the driving thin-film transistor T1. The first initialization voltage line VL1 may be configured to transmit a first initialization voltage Vint1 to the first initialization thin-film transistor T4 for initializing the driving thin-film transistor T1. The second initialization voltage line VL2 may be configured to transmit a second initialization voltage Vint2 to the second initialization thin-film transistor T7 for initializing the first electrode of the display element DPE.

A driving gate electrode of the driving thin-film transistor T1 may be connected to the storage capacitor Cst via a second node N2. Any one of a source region and a drain region of the driving thin-film transistor T1 may be connected to the driving voltage line PL via the operation control thin-film transistor T5 and a first node N1. The other one of the source region and the drain region of the driving thin-film transistor T1 may be electrically connected to the first electrode of the display element DPE via the emission control thin-film transistor T6 and a third node N3. The driving thin-film transistor T1 may be configured to receive the data signal Dm according to a switching operation of the switching thin-film transistor T2, and may supply a driving current to the display element DPE. In other words, the driving thin-film transistor T1 may control an amount of current that flows to the display element DPE from the first node N1 electrically connected to the driving voltage line PL, in response to a voltage applied to the second node N2 that varies according to the data signal Dm.

A switching gate electrode of the switching thin-film transistor T2 may be connected to the first scan line SL1 configured to transmit the first scan signal Sn to the switching thin-film transistor T2. Any one of a source region and a drain region of the switching thin-film transistor T2 may be connected to the data line DL. The other one of the source region and the drain region of the switching thin-film transistor T2 may be connected to the driving voltage line PL via the operation control thin-film transistor T5, and may be connected to the driving thin-film transistor T1 via the first node N1. The switching thin-film transistor T2 may be configured to transmit the data signal Dm from the data line DL to the first node N1, in response to a voltage applied to the first scan line SL1. In other words, the switching thin-film transistor T2 may be turned on in response to the first scan signal Sn via the first scan line SL1, and perform a switching operation for transmitting the data signal Dm received via the data line DL to the driving thin-film transistor T1 via the first node N1.

A compensation gate electrode of the compensation thin-film transistor T3 may be connected to the second scan line SL2. Any one of a source region and a drain region of the compensation thin-film transistor T3 may be connected to the first electrode of the display element DPE via the emission control thin-film transistor T6 and the third node N3. The other one of the source region and the drain region of the compensation thin-film transistor T3 may be connected to a lower electrode CE1 of the storage capacitor Cst and the driving gate electrode of the driving thin-film transistor T1 via the second node N2. The compensation thin-film transistor T3 may be turned on in response to the second scan signal Sn' received via the second scan line SL2, and may diode-connect the driving thin-film transistor T1.

A first initialization gate electrode of the first initialization thin-film transistor T4 may be connected to the previous scan line SLp. Any one of a source region and a drain region of the first initialization thin-film transistor T4 may be connected to the first initialization voltage line VL1. The other one of the source region and the drain region of the first initialization thin-film transistor T4 may be connected to the lower electrode CE1 of the storage capacitor Cst and the driving gate electrode of the driving thin-film transistor T1 via the second node N2. The first initialization thin-film transistor T4 may be configured to apply the first initialization voltage Vint1 to the second node N2 from the first initialization voltage line VL1, in response to a voltage applied to the previous scan line SLp. In other words, the first initialization thin-film transistor T4 may be turned on in response to the previous scan signal Sn−1 received via the previous scan line SLp, and may perform an initialization operation for applying the first initialization voltage Vint1 to the driving gate electrode of the driving thin-film transistor T1 to initializing a voltage of the driving gate electrode of the driving thin-film transistor T1.

An operation control gate electrode of the operation control thin-film transistor T5 may be connected to the emission control line EL. Any one of a source region and a drain region of the operation control thin-film transistor T5 may be connected to the driving voltage line PL. The other one of the source region and the drain region of the operation control thin-film transistor T5 may be connected to the driving thin-film transistor T1 and the switching thin-film transistor T2 via the first node N1.

An emission control gate electrode of the emission control thin-film transistor T6 may be connected to the emission control line EL. Any one of a source region and a drain region of the emission control thin-film transistor T6 may be connected to the driving thin-film transistor T1 and the compensation thin-film transistor T3 via the third node N3. The other one of the source region and the drain region of the emission control thin-film transistor T6 may be electrically connected to the first electrode of the display element DPE.

The operation control thin-film transistor T5 and the emission control thin-film transistor T6 may be concurrently (e.g., simultaneously or substantially simultaneously) turned on with each other in response to the emission control signal En received via the emission control line EL, and thus, the driving voltage ELVDD may be applied to the display element DPE such that a driving current may flow in the display element DPE.

A second initialization gate electrode of the second initialization thin-film transistor T7 may be connected to the next scan line SLn. Any one of a source region and a drain region of the second initialization thin-film transistor T7 may be connected to the first electrode of the display element DPE. The other one of the source region and the drain region of the second initialization thin-film transistor T7 may be connected to the second initialization voltage line VL2, and may receive the second initialization voltage Vint2. The second initialization thin-film transistor T7 may be turned on in response to the next scan signal Sn+1 received via the next scan line SLn, and thus, the first electrode of the display element DPE may be initialized. In some embodiments, the next scan line SLn and the first scan line SL1 may be the same line as each other. In this case, the same scan line may be configured to transmit the same electrical signal with a time difference, and may function as the first scan line SL1 and also as the next scan line SLn.

The second initialization thin-film transistor T7 may be connected to the next scan line SLn. However, the present disclosure is not limited thereto, and the second initialization thin-film transistor T7 may be connected to the emission control line EL, and driven according to the emission control signal En.

The storage capacitor Cst may include the lower electrode CE1 and an upper electrode CE2. The lower electrode CE1 of the storage capacitor Cst may be connected to the driving gate electrode of the driving thin-film transistor T1 via the second node N2. The upper electrode CE2 of the storage capacitor Cst may be connected to the driving voltage line PL. The storage capacitor Cst may store a charge corresponding to a voltage difference between the driving gate electrode voltage of the driving thin-film transistor T1 and the driving voltage ELVDD.

As described above, some of the plurality of thin-film transistors T1 to T7 may include an oxide semiconductor. For example, the compensation thin-film transistor T3 and the first initialization thin-film transistor T4 may include an oxide semiconductor.

In a case of polysilicon, which may be highly reliable, it may be precisely controlled so that an intended current flows. Accordingly, when a semiconductor layer including a highly-reliable polysilicon is included in the driving thin-film transistor T1 that directly affects a brightness of the display device, a high-resolution display device may be implemented. In addition, an oxide semiconductor has high carrier mobility and low leakage current, and thus, a voltage drop may not be large even when a driving time is long. In other words, in an oxide semiconductor, a change in color of an image according to a voltage drop may not be large, even when the display device is driven at low frequencies, and thus, the display device may be driven at low frequencies. Accordingly, when the compensation thin-film transistor T3 and the first initialization thin-film transistor T4 include an oxide semiconductor, a display device having reduced power consumption while preventing or substantially preventing a leakage current may be implemented.

Such an oxide semiconductor may be sensitive to light, and thus, an amount of current or the like may vary depending on external light. Accordingly, a metal layer may be disposed under the oxide semiconductor, and may absorb or reflect the external light. In each of the compensation thin-film transistor T3 and the first initialization thin-film transistor T4 including the oxide semiconductor, a gate electrode may be located over and under an oxide semiconductor layer. In other words, when viewed in the z-axis direction (e.g., in a plan view), the metal layer disposed under the oxide semiconductor may overlap with the oxide semiconductor.

Figure 6:
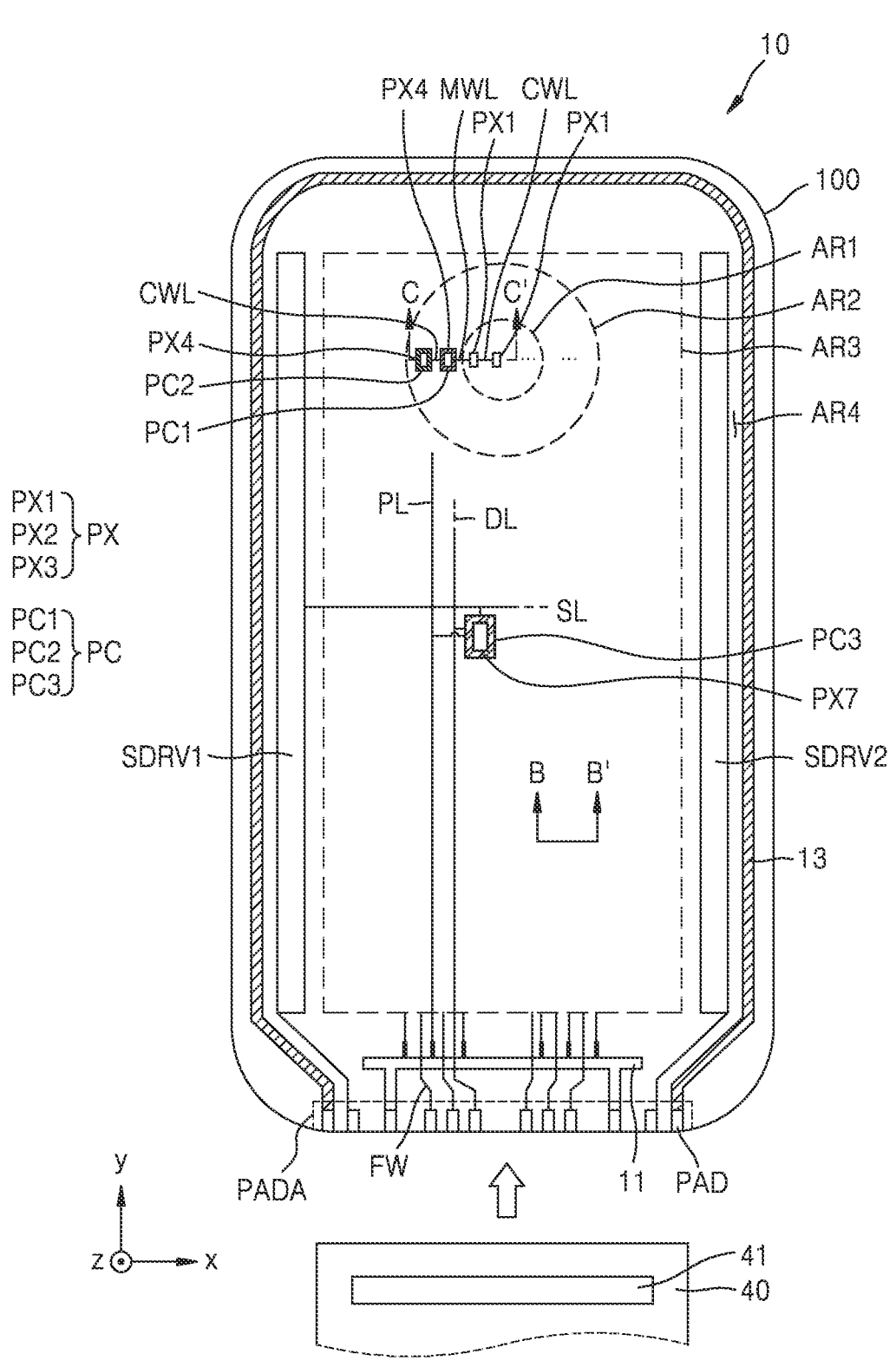
FIGS. 6 and 7 are schematic plan views illustrating a display panel according to embodiments.
Figure 7:
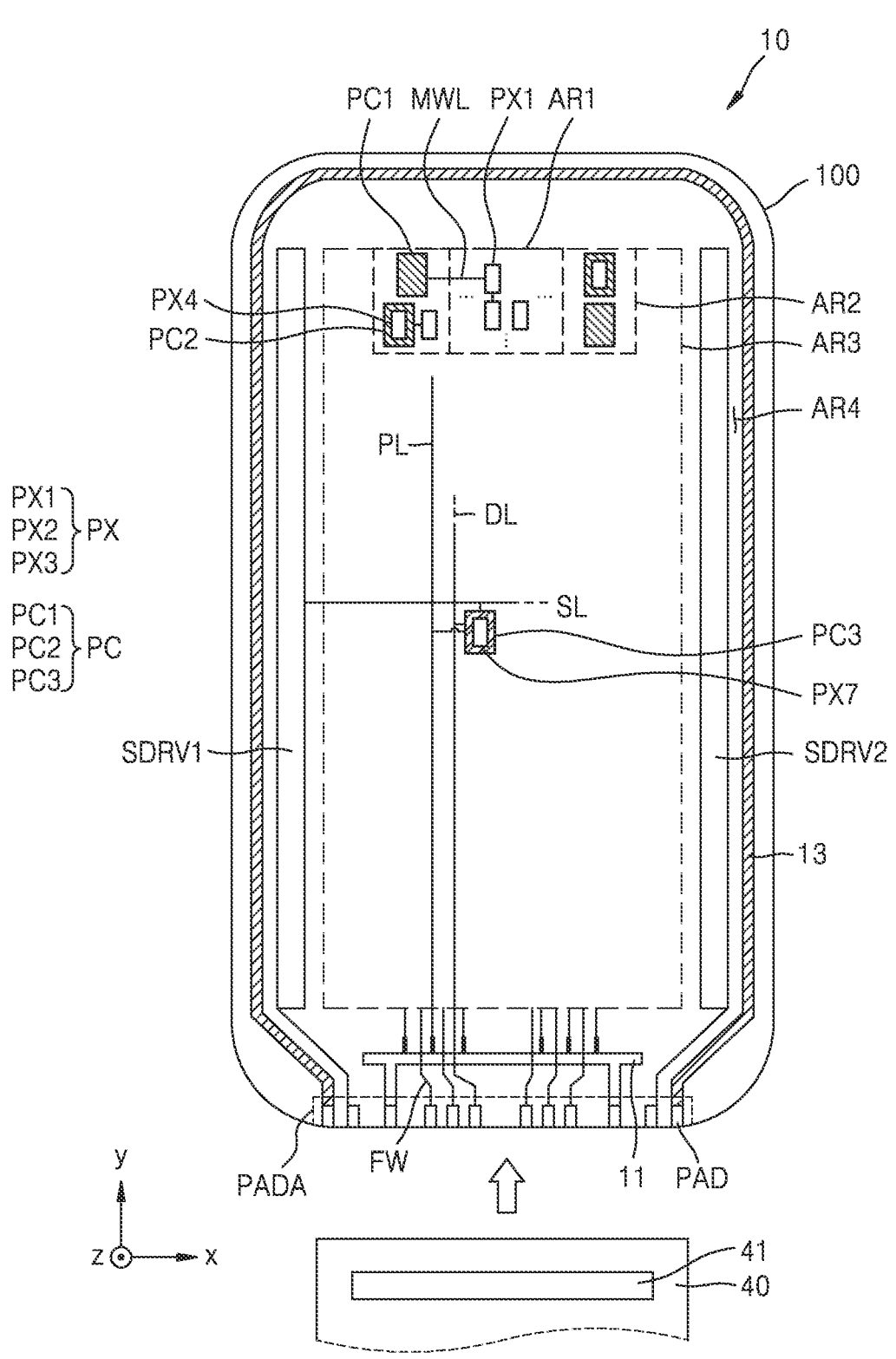

FIGS. 6 and 7 are schematic plan views illustrating a display panel 10 according to embodiments. In FIGS. 6 and 7, the same reference numerals are used to denote the same or substantially the same members as those described above with reference to FIGS. 1 and 2, and thus, redundant description thereof may not be repeated.

Referring to FIGS. 6 and 7, the display panel 10 may include a substrate 100, a pixel circuit PC, and a pixel PX. In an embodiment, the substrate 100 may include a first area AR1, a second area AR2, a third area AR3, and a fourth area AR4. As shown in FIG. 6, the second area AR2 may entirely surround (e.g., around a periphery of) the first area AR1. As another example, as shown in FIG. 7, the second area AR2 may be disposed on one or more sides of the first area AR1. The third area AR3 may at least partially surround (e.g., around peripheries of) the first area AR1 and/or the second area AR2. The fourth area AR4 may at least partially surround (e.g., around a periphery of) the third area AR3.

The pixel circuit PC may include a first pixel circuit PC1, a second pixel circuit PC2, and a third pixel circuit PC3. In an embodiment, the first pixel circuit PC1 and the second pixel circuit PC2 may be arranged at (e.g., in or on) the second area AR2. The third pixel circuit PC3 may be arranged at (e.g., in or on) the third area AR3. In other words, the pixel circuit PC may not be arranged at (e.g., in or on) the first area AR1.

The pixel PX may be implemented as a display element, such as an organic light-emitting diode. The pixel PX may include a first pixel PX1, a second pixel PX2 (e.g., see FIG. 10), a third pixel PX3, a fourth pixel PX4, a fifth pixel PX5 (e.g., see FIG. 12), a sixth pixel PX6, and a seventh pixel PX7. The first pixel PX1, the second pixel PX2, and the third pixel PX3 may be arranged at (e.g., in or on) the first area AR1. The first pixel PX1 may be electrically connected to the first pixel circuit PC1. In an embodiment, the first pixel PX1 may be electrically connected to the first pixel circuit PC1 through an intermediate connection line MWL. In an embodiment, one of a plurality of first pixels PX1 may be electrically connected to another one of the plurality of first pixels PX1. In this case, the one of the plurality of first pixels PX1 and the other one of the plurality of first pixels PX1 may be connected to one first pixel circuit PC1 to emit the same light (e.g., the same colored light).

The fourth pixel PX4, the fifth pixel PX5, and the sixth pixel PX6 may be arranged at (e.g., in or on) the second area AR2. The fourth pixel PX4 may be electrically connected to the second pixel circuit PC2. The fourth pixel PX4 may overlap with the second pixel circuit PC2. In an embodiment, one of a plurality of fourth pixels PX4 may be electrically connected to another one of the plurality of fourth pixels PX4. In this case, the one of the plurality of fourth pixels PX4 and the other one of the plurality of fourth pixels PX4 may be connected to one second pixel circuit PC2 to emit the same light (e.g., the same colored light).

The seventh pixel PX7 may be arranged at (e.g., in or on) the third area AR3. The seventh pixel PX7 may be electrically connected to the third pixel circuit PC3. The seventh pixel PX7 may overlap with the third pixel circuit PC3.

In an embodiment, the resolution of the display panel 10 in the first area AR1 and/or the second area AR2 may be less than or equal to the resolution of the display panel in the third area AR3. For example, the resolution of the display panel 10 in the first area AR1 and/or the second area AR2 may be about $\frac{1}{2}$, $\frac{3}{8}$, $\frac{1}{3}$, $\frac{1}{4}$, $\frac{2}{9}$, $\frac{1}{8}$, $\frac{1}{9}$, or $\frac{1}{16}$ of the resolution of the display panel 10 in the third area AR3.

The fourth area AR4 may be a non-display area in which the pixels PX are not arranged. A first scan driving circuit SDRV1, a second scan driving circuit SDRV2, a pad PAD, a driving voltage supply line 11, and a common voltage supply line 13 may be arranged at (e.g., in or on) the fourth area AR4.

One of the first scan driving circuit SDRV1 and the second scan driving circuit SDRV2 may apply a scan signal to the pixel circuit PC through a scan line SL. In an embodiment, the first scan driving circuit SDRV1 and the second scan driving circuit SDRV2 may be located on opposite sides, with the third area AR3 therebetween. In an embodiment, one of the plurality of pixels PX may receive a scan signal from the first scan driving circuit SDRV1, and another one of the plurality of pixels PX may receive a scan signal from the second scan driving circuit SDRV2.

The pad PAD may be arranged at (e.g., in or on) a pad area PADA that is at one side of the fourth area AR4. The pad PAD may be exposed without being covered by an insulating layer, and may be connected to a display circuit board 40. A display driver 41 may be disposed on the display circuit board 40.

The display driver 41 may generate a signal transmitted to the first scan driving circuit SDRV1 and the second scan driving circuit SDRV2. The display driver 41 may generate a data signal, and the generated data signal may be transferred to the pixel circuit PC through a fan-out line FW, and a data line DL connected to the fan-out line FW.

The display driver 41 may supply the driving voltage ELVDD (e.g., see FIG. 4) to the driving voltage supply line 11, and may supply the common voltage ELVSS to the common voltage supply line 13. The driving voltage ELVDD may be supplied to the pixel circuit PC through a driving voltage line PL connected to the driving voltage supply line 11. The common voltage ELVSS may be supplied to an opposite electrode of the display element connected to the common voltage supply line 13.

Figure 8:
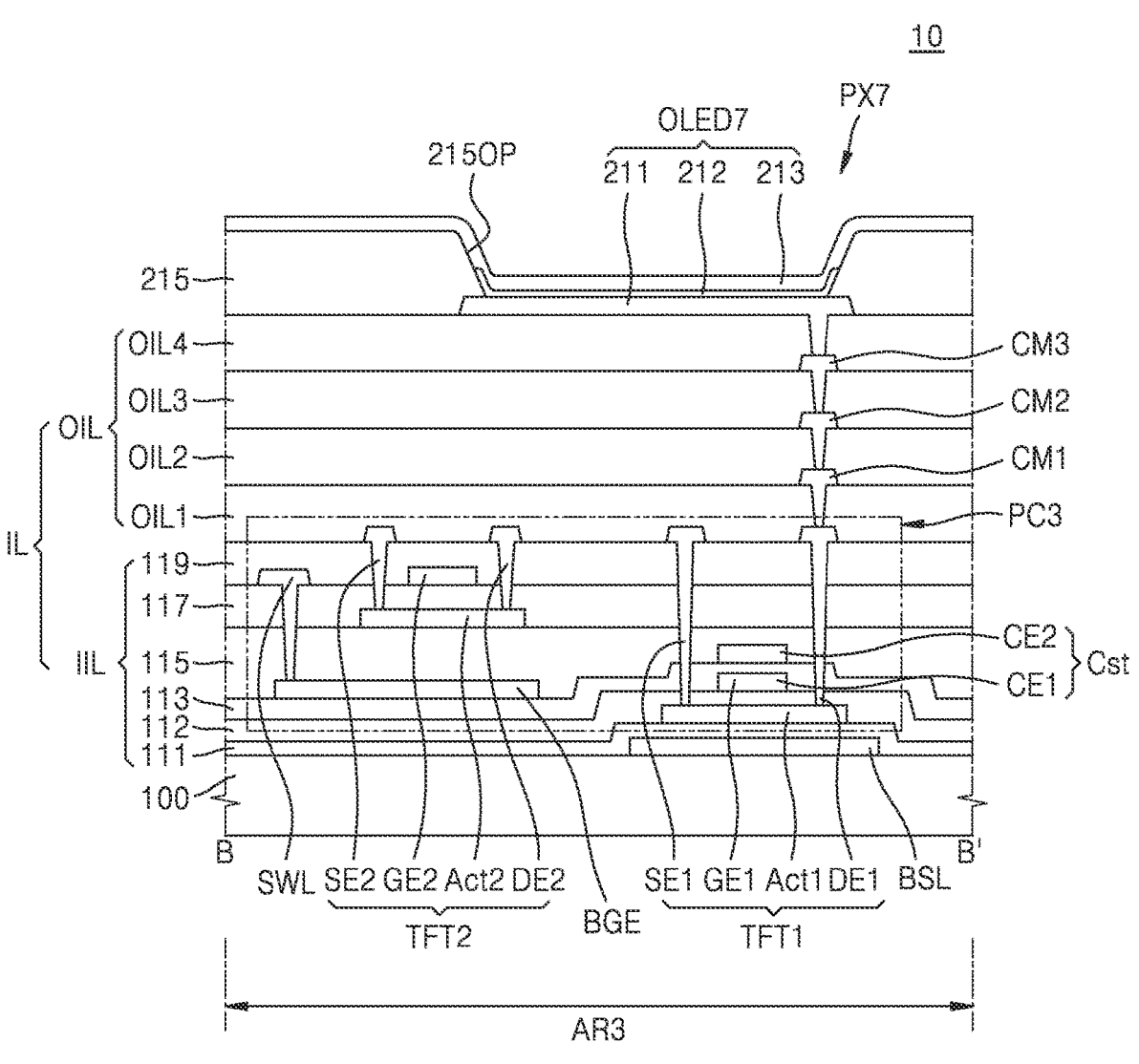
FIG. 8 is a schematic cross-sectional view illustrating a display device according to an embodiment.

FIG. 8 is a schematic cross-sectional view illustrating a display device according to an embodiment. In more detail, FIG. 8 is a schematic cross-sectional view illustrating the display panel 10 of FIG. 6 taken along the line B-B' in FIG. 6.

Referring to FIG. 8, the display panel 10 may include a substrate 100, an insulating layer IL, a third pixel circuit PC3, a seventh organic light-emitting diode OLED7 as a display element, and a pixel-defining layer 215.

The substrate 100 may include (e.g., may be) glass or a polymer resin, such as polyethersulfone, polyarylate, polyether imide, polyethylene naphthalate, polyethylene terephthalate, polyphenylene sulfide, polyimide, polycarbonate, cellulose triacetate, or cellulose acetate propionate.

In an embodiment, the substrate 100 may have a multi-layered structure including a base layer including the polymer resin described above, and and a barrier layer. The substrate 100 including the polymer resin may be flexible, rollable, and/or bendable.

The insulating layer IL may be disposed on the substrate 100. The insulating layer IL may include an inorganic insulating layer IIL and an organic insulating layer OIL. In an embodiment, the inorganic insulating layer IIL may include a buffer layer 111, a first gate insulating layer 112, a second gate insulating layer 113, a first interlayer insulating layer 115, a third gate insulating layer 117, and a second interlayer insulating layer 119.

The third pixel circuit PC3 may be arranged at (e.g., in or on) the third area AR3. The third pixel circuit PC3 may include a first thin-film transistor TFT1, a second thin-film transistor TFT2, and a storage capacitor Cst. The first thin-film transistor TFT1 may include a first semiconductor layer Act1, a first gate electrode GE1, a first source electrode SE1, and a first drain electrode DE1. The second thin-film transistor TFT2 may include a second semiconductor layer Act2, a second gate electrode GE2, a second source electrode SE2, and a second drain electrode DE2. The storage capacitor Cst may include a lower electrode CE1 and an upper electrode CE2.

The buffer layer 111 may be disposed on the substrate 100. The buffer layer 111 may include an inorganic insulating material, such as $SiN_x$, SiON, or $SiO_2$, and may have a single layer or multiple layers including one or more of the aforementioned inorganic insulating materials.

The first semiconductor layer Act1 may include a silicon semiconductor. The first semiconductor layer Act1 may include polysilicon. As another example, the first semiconductor layer Act1 may include amorphous silicon. As another example, the first semiconductor layer Act1 may include an oxide semiconductor or an organic semiconductor. The first semiconductor layer Act1 may include a channel region, and a drain region and a source region disposed on opposite sides, respectively, of the channel region.

The first gate electrode GE1 may overlap with the first semiconductor layer Act1. In more detail, the first gate electrode GE1 may overlap with the channel region of the first semiconductor layer Act1. The first gate electrode GE1 may include a low-resistance metal material. The first gate electrode GE1 may include a conductive material, such as molybdenum (Mo), aluminum (Al), copper (Cu), titanium (Ti), or the like, and may include multiple layers or a single layer including one or more of the aforementioned materials.

The first gate insulating layer 112 may be disposed between the first semiconductor layer Act1 and the first gate electrode GE1. Accordingly, the first semiconductor layer Act1 may be insulated from the first gate electrode GE1. The first gate insulating layer 112 may include an inorganic insulating material, such as $SiO_2$, $SiN_x$, SiON, $Al_2O_3$, $TiO_2$, $Ta_2O_5$, hafnium oxide ($HfO_2$), and/or ZnO.

The second gate insulating layer 113 may cover the first gate electrode GE1. The second gate insulating layer 113 may be disposed on the first gate electrode GE1. The second gate insulating layer 113 may include an inorganic insulating material, such as $SiO_2$, $SiN_x$, SiON, $Al_2O_3$, $TiO_2$, $Ta_2O_5$, hafnium oxide ($HfO_2$), and/or ZnO. The upper electrode CE2 may be disposed on the second gate insulating layer 113. The upper electrode CE2 may overlap with the first gate electrode GE1 disposed thereunder. In this case, the upper electrode CE2 and the first gate electrode GE1 may overlap with each other with the second gate insulating layer 113 therebetween, to form the storage capacitor Cst. In other words, the first gate electrode GE1 of the first thin-film transistor TFT1 may function as the lower electrode CE1 of the storage capacitor Cst. As such, the storage capacitor Cst and the first thin-film transistor TFT1 may overlap with each other. However, the present disclosure is not limited thereto. For example, the storage capacitor Cst may be formed so as not to overlap with the first thin-film transistor TFT1.

The upper electrode CE2 may include aluminum (Al), platinum (Pt), palladium (Pd), silver (Ag), magnesium (Mg), gold (Au), nickel (Ni), neodymium (Nd), iridium (Ir), chromium (Cr), calcium (Ca), molybdenum (Mo), titanium (Ti), tungsten (W), and/or copper (Cu), and may include a single layer or multiple layers including one or more of the aforementioned materials.

The first interlayer insulating layer 115 may cover the upper electrode CE2. The first interlayer insulating layer 115 may include an inorganic insulating material, such as $SiO_2$, $SiN_x$, SiON, $Al_2O_3$, $TiO_2$, $Ta_2O_5$, $HfO_2$, and/or ZnO. The first interlayer insulating layer 115 may include a single layer or multiple layers including one or more of the aforementioned inorganic insulating materials.

The second semiconductor layer Act2 may be disposed on the first interlayer insulating layer 115. The second semiconductor layer Act2 may include an oxide semiconductor. For example, the second semiconductor layer Act2 may include a Zn oxide-based material, and may include Zn oxide, In—Zn oxide, Ga—In—Zn oxide, or the like. As another example, the second semiconductor layer Act2 may include In—Ga—Zn—O (IGZO), In—Sn—Zn—O (ITZO), or In—Ga—Sn—Zn—O (IGTZO) semiconductor, in which suitable metals, such as indium (In), gallium (Ga), and/or tin (Sn), are contained in zinc oxide (ZnO).

In an embodiment, the second semiconductor layer Act2 may include a channel region, and a source region and a drain region disposed on opposite sides of the channel region. The source and drain regions of the second semiconductor layer Act2 may be formed by adjusting a carrier concentration of an oxide semiconductor to make the source and drain regions conductive. For example, the source region and the drain region of the second semiconductor layer Act2 may be formed by increasing the carrier concentration through plasma treatment using a hydrogen-based gas, a fluorine-based gas, or a combination thereof in an oxide semiconductor.

The third gate insulating layer 117 may cover the second semiconductor layer Act2. The third gate insulating layer 117 may be disposed between the second semiconductor layer Act2 and the second gate electrode GE2. In an embodiment, the third gate insulating layer 117 may be entirely disposed on the substrate 100. As another example, the third gate insulating layer 117 may be patterned according to a shape of the second gate electrode GE2. The third gate insulating layer 117 may include an inorganic insulating material, such as $SiO_2$, $SiN_x$, SiON, $Al_2O_3$, $TiO_2$, $Ta_2O_5$, $HfO_2$, and/or ZnO. The third gate insulating layer 117 may include a single layer or multiple layers including one or more of the aforementioned inorganic insulating materials.

The second gate electrode GE2 may be disposed on the third gate insulating layer 117. The second gate electrode GE2 may overlap with the second semiconductor layer Act2. In more detail, the second gate electrode GE2 may overlap with the channel region of the second semiconductor layer Act2. The second gate electrode GE2 may include a conductive material, such as Mo, Al, Cu, Ti, or the like, and may include multiple layers or a single layer including one or more of the aforementioned materials.

The second interlayer insulating layer 119 may cover the second gate electrode GE2. The second interlayer insulating layer 119 may include $SiO_2$, $SiN_X$, SiON, $Al_2O_3$, $TiO_2$, $Ta_2O_5$, $HfO_2$, ZnO, or the like. The second interlayer insulating layer 119 may include a single layer or multiple layers including one or more of the aforementioned inorganic insulating materials.

The first source electrode SE1 and the first drain electrode DE1 may be disposed on the second interlayer insulating layer 119. The first source electrode SE1 and/or the first drain electrode DE1 may be electrically connected to the first semiconductor layer Act1. The first source electrode SE1 and/or the first drain electrode DE1 may be electrically connected to the first semiconductor layer Act1 through contact holes defined in (e.g., penetrating) the insulating layers thereunder.

The second source electrode SE2 and the second drain electrode DE2 may be disposed on the second interlayer insulating layer 119. The second source electrode SE2 and/or the second drain electrode DE2 may be electrically connected to the second semiconductor layer Act2. The second source electrode SE2 and/or the second drain electrode DE2 may be electrically connected to the second semiconductor layer Act2 through contact holes defined in (e.g., penetrating) the insulating layers thereunder.

The first source electrode SE1, the first drain electrode DE1, the second source electrode SE2, and the second drain electrode DE2 may each include a suitable material having a suitable conductivity (e.g., a good conductivity). The first source electrode SE1, the first drain electrode DE1, the second source electrode SE2, and the second drain electrode DE2 may each include a suitable conductive material, such as Mo, Al, Cu, Ti, or the like, and may include multiple layers or a single layer including one or more of the aforementioned materials. In an embodiment, the first source electrode SE1, the first drain electrode DE1, the second source electrode SE2, and the second drain electrode DE2 may each have a multi-layered structure including Ti/Al/Ti layers.

Because the first thin-film transistor TFT1 including the first semiconductor layer Act1 including a silicon semiconductor has high reliability, the first thin-film transistor TFT1 may be used as the driving thin-film transistor to implement a high-quality display panel 10.

Because the oxide semiconductor has high carrier mobility and low leakage current, a voltage drop may not be large even if the driving time is long. In other words, because a color change of an image due to the voltage drop is not large even during low-frequency driving, low-frequency driving may be possible. As such, because the oxide semiconductor has a low leakage current, the leakage current may be prevented or substantially prevented, and power consumption may be reduced by employing the oxide semiconductor for at least one of the other thin-film transistors other than the driving thin-film transistor. For example, the second thin-film transistor TFT2 may be employed as a switching thin-film transistor. As another example, when the third pixel circuit PC3 includes a plurality of thin-film transistors, some of the thin-film transistors from among the plurality of thin-film transistors may use silicon semiconductors, and the remaining thin-film transistors may use oxide semiconductors.

A lower gate electrode BGE may be disposed under the second semiconductor layer Act2. In an embodiment, the lower gate electrode BGE may be disposed between the second gate insulating layer 113 and the first interlayer insulating layer 115. In an embodiment, the lower gate electrode BGE may receive a gate signal. In this case, the second thin-film transistor TFT2 may have a double gate electrode structure in which the gate electrodes are disposed above and below the second semiconductor layer Act2.

In an embodiment, a sub wiring line SWL may be disposed between the third gate insulating layer 117 and the second interlayer insulating layer 119. In an embodiment, the sub wiring line SWL may be electrically connected to the lower gate electrode BGE through contact holes defined in (e.g., penetrating) the first interlayer insulating layer 115 and the third gate insulating layer 117.

In an embodiment, a lower blocking layer BSL may be disposed between the substrate 100 and the third pixel circuit PC3. In an embodiment, the lower blocking layer BSL may overlap with the first thin-film transistor TFT1. A constant or substantially constant voltage may be applied to the lower blocking layer BSL. As the lower blocking layer BSL is disposed under the first thin-film transistor TFT1, the first thin-film transistor TFT1 may be less affected by peripheral interference signals, and thus, the reliability of the first thin-film transistor TFT1 may be improved.

The lower blocking layer BSL may include a transparent conductive material. For example, the lower blocking layer BSL may include TCO. The lower blocking layer BSL may include a conductive oxide, such as ITO, IZO, ZnO, $In_2O_3$, IGO, or AZO.

The organic insulating layer OIL may be disposed on the inorganic insulating layer IIL. In an embodiment, the organic insulating layer OIL may be disposed on the substrate 100. The organic insulating layer OIL may include a first organic insulating layer OIL1, a second organic insulating layer OIL2, a third organic insulating layer OIL3, and a fourth organic insulating layer OIL4. However, the present disclosure is not limited thereto. For example, in some embodiments, the organic insulating layer OIL may include the first organic insulating layer OIL1 and the second organic insulating layer OIL2, or may include the first organic insulating layer OIL1, the second organic insulating layer OIL2, and the third organic insulating layer OIL3. In other words, the organic insulating layer OIL may be provided as two or three layers, instead of four layers.

The first organic insulating layer OIL1 may be disposed to cover the first source electrode SE1, the first drain electrode DE1, the second source electrode SE2, and the second drain electrode DE2. The first organic insulating layer OIL1 may include an organic material. For example, the first organic insulating layer OIL1 may include an organic insulating material, such as a general purpose polymer, such as polymethylmethacrylate (PMMA) or polystyrene (PS), a polymer derivative having a phenolic group, an acryl-based polymer, an imide-based polymer, an aryl ether-based polymer, an amide-based polymer, a fluorine-based polymer, a p-xylene-based polymer, a vinyl alcohol-based polymer, or a suitable blend thereof.

A first connection electrode CM1 may be disposed on the first organic insulating layer OIL1. In this case, the first connection electrode CM1 may be electrically connected to the third pixel circuit PC3 through a contact hole defined in (e.g., penetrating) the first organic insulating layer OIL1. For example, the first connection electrode CM1 may be electrically connected to the first source electrode SE1 or the first drain electrode DE1 through the contact hole defined in the first organic insulating layer OIL1.

The first connection electrode CM1 may include a suitable material having a suitable conductivity (e.g., a good conductivity). The first connection electrode CM1 may include a conductive material, such as Mo, Al, Cu, Ti, or the like, and may include multiple layers or a single layer including one or more of the aforementioned materials. In an embodiment, the first connection electrode CM1 may have a multi-layered structure including Ti/Al/Ti layers.

The second organic insulating layer OIL2 may be disposed to cover the first connection electrode CM1. The second organic insulating layer OIL2 may include an organic material. In an embodiment, the second organic insulating layer OIL2 may include the same material as that of the first organic insulating layer OIL1. As another example, the second organic insulating layer OIL2 may include a material different from that of the first organic insulating layer OIL1.

A second connection electrode CM2 may be disposed on the second organic insulating layer OIL2. In this case, the second connection electrode CM2 may be electrically connected to the first connection electrode CM1 through a contact hole defined in (e.g., penetrating) the second organic insulating layer OIL2.

The second connection electrode CM2 may include a suitable material having a suitable conductivity (e.g., a good conductivity). The second connection electrode CM2 may include a conductive material, such as Mo, Al, Cu, Ti, or the like, and may include multiple layers or a single layer including one or more of the aforementioned materials. In an embodiment, the second connection electrode CM2 may have a multi-layered structure including Ti/Al/Ti layers.

The third organic insulating layer OIL3 may be disposed to cover the second connection electrode CM2. The third organic insulating layer OIL3 may include an organic material. In an embodiment, the third organic insulating layer OIL3 may include the same material as that of the first organic insulating layer OIL1. As another example, the third organic insulating layer OIL3 may include a material different from that of the first organic insulating layer OIL1.

A third connection electrode CM3 may be disposed on the third organic insulating layer OIL3. In this case, the third connection electrode CM3 may be electrically connected to the second connection electrode CM2 through a contact hole defined in (e.g., penetrating) the third organic insulating layer OIL3. However, the third connection electrode CM3 may be omitted as needed or desired. When the third connection electrode CM3 is omitted, a pixel electrode 211 may be directly electrically connected to the second connection electrode CM2.

The third connection electrode CM3 may include a suitable material having a suitable conductivity (e.g., a good conductivity). The third connection electrode CM3 may include a conductive material, such as Mo, Al, Cu, Ti, or the like, and may include multiple layers or a single layer including one or more of the aforementioned materials. In an embodiment, the third connection electrode CM3 may have a multi-layered structure including Ti/Al/Ti layers.

The fourth organic insulating layer OIL4 may be disposed to cover the third connection electrode CM3. The fourth organic insulating layer OIL4 may include an organic material. In an embodiment, the fourth organic insulating layer OIL4 may include the same material as that of the first organic insulating layer OIL1. As another example, the fourth organic insulating layer OIL4 may include a material different from that of the first organic insulating layer OIL1.

As a display element, the seventh organic light-emitting diode OLED7 may be disposed on the organic insulating layer OIL. The seventh organic light-emitting diode OLED7 may be electrically connected to a pixel circuit. The seventh organic light-emitting diode OLED7 may be electrically connected to the third pixel circuit PC3 to implement the seventh pixel PX7 at (e.g., in or on) the third area AR3. In an embodiment, the seventh organic light-emitting diode OLED7 may overlap with the third pixel circuit PC3. The seventh organic light-emitting diode OLED7 may include the pixel electrode 211, an intermediate layer 212, and an opposite electrode 213.

The pixel electrode 211 may be disposed on the organic insulating layer OIL. For example, the pixel electrode 211 may be disposed on the fourth organic insulating layer OIL4. The pixel electrode 211 may be electrically connected to the third connection electrode CM3 through a contact hole defined in (e.g., penetrating) the fourth organic insulating layer OIL4. The pixel electrode 211 may include a conductive oxide, such as ITO, IZO, ZnO, $In_2O_3$, IGO, or AZO. As another example, the pixel electrode 211 may include a reflective layer including Ag, Mg, Al, Pt, Pd, Au, Ni, Nd, Ir, Cr, or a suitable compound thereof. As another example, the pixel electrode 211 may further include a layer including ITO, IZO, ZnO, or $In_2O_3$ above/below the reflective layer.

The pixel-defining layer 215 having an opening 2150P exposing at least a portion of the pixel electrode 211 may be disposed on the pixel electrode 211. In more detail, the opening 2150P defined in the pixel-defining layer 215 may expose a central portion of the pixel electrode 211. The pixel-defining layer 215 may include an organic insulating material, and/or an inorganic insulating material. An emission area of light emitted from the seventh organic light-emitting diode OLED7 may be defined by the opening 2150P.

The intermediate layer 212 may include an emission layer. The emission layer may include a low-molecular material or a high-molecular material, and may emit red, green, blue, or white light. When the emission layer includes a low-molecular material, the intermediate layer 212 may have a structure in which a hole injection layer (HIL), a hole transport layer (HTL), an emission layer (EML), an electron transport layer (ETL), an electron injection layer (EIL), and/or the like are stacked in a single or complex structure, and may include various suitable organic materials, such as copper phthalocyanine (CuPc), N,N'-Di(naphthalene-1-yl)-N,N'-diphenyl-benzidine (NPB), tris-8-hydroxyquinoline aluminum (Alq3), and/or the like. These layers may be formed by vacuum deposition.

When the emission layer includes a high-molecular material, the intermediate layer 212 may have a structure including an HTL and an EML. In this case, the HTL may include PEDOT, and the EML may include poly-phenylenevinylene (PPV)-based or polyfluorene-based high-molecular material. The intermediate layer 212 may be formed by screen printing, inkjet printing, laser induced thermal imaging (LITI), or the like.

The opposite electrode 213 may be disposed on the intermediate layer 212. The opposite electrode 213 may include a conductive material having a low work function. For example, the opposite electrode 213 may include a (semi)transparent layer including Ag, Mg, Al, Pt, Pd, Au, Ni, Nd, Ir, Cr, Li, Ca, or a suitable alloy thereof. As another example, the opposite electrode 213 may further include a layer including ITO, IZO, ZnO, or $In_2O_3$ on the (semi) transparent layer including one or more of the aforementioned materials.

Figure 9:
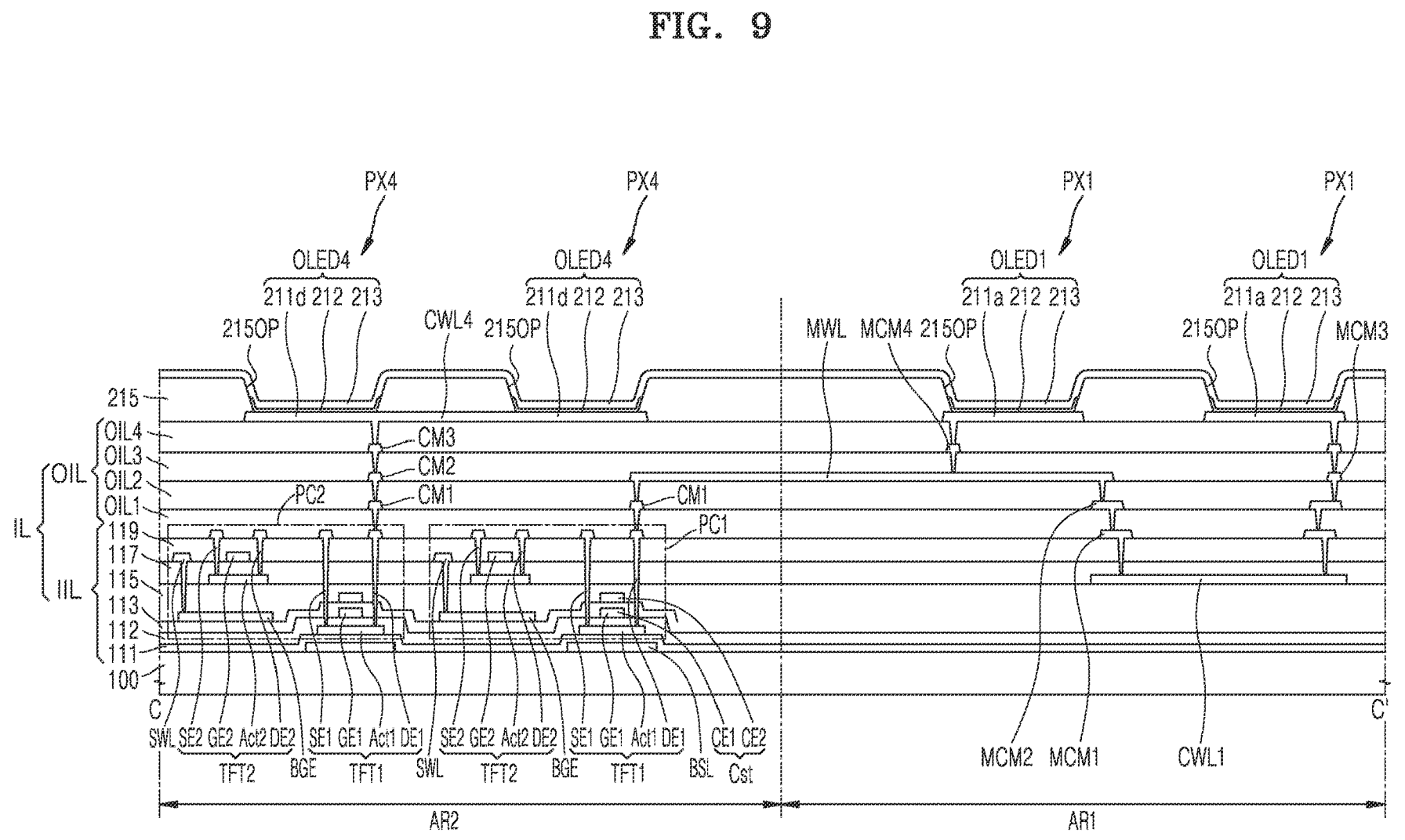

FIG. 9 is a schematic cross-sectional view illustrating a display device according to an embodiment. In more detail, FIG. 9 is a schematic cross-sectional view illustrating the display panel 10 of FIG. 6 taken along the line C-C' in FIG. 6. In FIG. 9, the same reference numerals are used to denote the same or substantially the same members as those described above with reference to FIG. 8, and thus, redundant description thereof may not be repeated.

Referring to FIG. 9, the display panel 10 may include a substrate 100, an insulating layer IL, a first pixel circuit PC1, a second pixel circuit PC2, first organic light-emitting diodes OLED1, fourth organic light-emitting diodes OLED4, and a pixel-defining layer 215.

In an embodiment, the first pixel circuit PC1, the second pixel circuit PC2, and the fourth organic light-emitting diodes OLED4 may be arranged at (e.g., in or on) the second area AR2, and the first organic light-emitting diodes OLED1 may be arranged at (e.g., in or on) the first area AR1. Each of the first organic light-emitting diodes OLED1 arranged at (e.g., in or on) the first area AR1 may emit light to implement a corresponding first pixel PX1. Each of the fourth organic light-emitting diodes OLED4 arranged at (e.g., in or on) the second area AR2 may emit light to implement a corresponding fourth pixel PX4.

The first pixel circuit PC1 and the second pixel circuit PC2 may be arranged at (e.g., in or on) the second area AR2. Each of the first pixel circuit PC1 and the second pixel circuit PC2 may include a first thin-film transistor TFT1, a second thin-film transistor TFT2, and a storage capacitor Cst. The first thin-film transistor TFT1 may include a first semiconductor layer Act1, a first gate electrode GE1, a first source electrode SE1, and a first drain electrode DE1. The second thin-film transistor TFT2 may include a second semiconductor layer Act2, a second gate electrode GE2, a second source electrode SE2, and a second drain electrode DE2. The storage capacitor Cst may include a lower electrode CE1 and an upper electrode CE2.

A first connection electrode CM1 may be disposed on a first organic insulating layer OIL1 of the second area AR2, a second connection electrode CM2 may be disposed on a second organic insulating layer OIL2, and a third connection electrode CM3 may be disposed on a third organic insulating layer OIL3. In addition, a first intermediate connection electrode MCM1 may be disposed on a second interlayer insulating layer 119 of the first area AR1, and a second intermediate connection electrode MCM2 may be disposed on the first organic insulating layer OIL1. A third intermediate connection electrode MCM3 may be disposed on the second organic insulating layer OIL2, and a fourth intermediate connection electrode MCM4 may be disposed on the third organic insulating layer OIL3.

The first intermediate connection electrode MCM1 of the first area AR1 may be at (e.g., in or on) the same layer as that of the first source electrode SE1 of the second area AR2, and may include the same material as that of the first source electrode SE1 of the second area AR2. The second intermediate connection electrode MCM2 of the first area AR1 may be at (e.g., in or on) the same layer as and include the same material as those of the first connection electrode CM1 of the second area AR2. The third intermediate connection electrode MCM3 of the first area AR1 may be at (e.g., in or on) the same layer as and include the same material as those of the second connection electrode CM2 of the second area AR2. The fourth intermediate connection electrode MCM4 of the first area AR1 may be at (e.g., in or on) the same layer as and include the same material as those of the third connection electrode CM3 of the second area AR2.

In an embodiment, the fourth organic light-emitting diode OLED4 may be disposed on a fourth organic insulating layer OIL4 of the second area AR2. However, the present disclosure is not limited thereto. As described below with reference to FIG. 12, a fifth organic light-emitting diode OLED5 and a sixth organic light-emitting diode OLED6 may be arranged at (e.g., in or on) the second area AR2. The fourth organic light-emitting diode OLED4 may include a fourth pixel electrode 211d, an intermediate layer 212, and an opposite electrode 213.

In an embodiment, a fourth connection line CWL4 may be arranged at (e.g., in or on) the second area AR2. The fourth connection line CWL4 may be disposed on the fourth organic insulating layer OIL4. The fourth connection line CWL4 may be at (e.g., in or on) the same layer as and include the same material as those of the fourth pixel electrode 211d of the fourth organic light-emitting diode OLED4. The fourth connection line CWL4 may be integrally provided with the fourth pixel electrode 211d.

The fourth connection line CWL4 may electrically connect the fourth organic light-emitting diodes OLED4 to each other. Two fourth organic light-emitting diodes OLED4 may be electrically connected to each other by the fourth connection line CWL4. In other words, two fourth pixel electrodes 211d may be electrically connected to each other by the fourth connection line CWL4. However, the present disclosure is not limited thereto. Two or more fourth organic light-emitting diodes OLED4 may be electrically connected to each other through one fourth connection line CWL4.

Because the second pixel circuit PC2 arranged at (e.g., in or on) the second area AR2 and one of the fourth organic light-emitting diodes OLED4 are electrically connected to each other, and because the one of the fourth organic light-emitting diodes OLED4 and another of the fourth organic light-emitting diodes OLED4 are electrically connected to each other through the fourth connection line CWL4, two fourth organic light-emitting diodes OLED4 may be driven through one second pixel circuit PC2.

Although the fourth organic light-emitting diode OLED4 is described in more detail with reference to FIG. 9, the fifth organic light-emitting diode OLED5 and the sixth organic light-emitting diode OLED6 may be provided to have the same or substantially the same (or similar) structure as that of the fourth organic light-emitting diode OLED4, and thus, redundant description thereof may not be repeated.

In an embodiment, the first organic light-emitting diode OLED1 may be disposed on the fourth organic insulating layer OIL4 of the first area AR1. However, the present disclosure is not limited thereto. As described below with reference to FIG. 10, a second organic light-emitting diode OLED2 and a third organic light-emitting diode OLED3 may be arranged at (e.g., in or on) the first area AR1. The first organic light-emitting diode OLED1 may include a first pixel electrode 211a, an intermediate layer 212, and an opposite electrode 213.

A pixel circuit may not be arranged at (e.g., in or on) the first area AR1. In more detail, although the first organic light-emitting diodes OLED1 are arranged at (e.g., in or on) the first area AR1, the pixel circuit (e.g., the pixel circuit PC1) for driving the first organic light-emitting diodes OLED1 arranged at (e.g., in or on) the first area AR1 may be arranged at (e.g., in or on) the second area AR2. In other words, the first organic light-emitting diodes OLED1 arranged at (e.g., in or on) the first area AR1 may be driven through the first pixel circuit PC1 arranged at (e.g., in or on) the second area AR2.

In an embodiment, the first pixel circuit PC1 arranged at (e.g., in or on) the second area AR2 and the first organic light-emitting diode OLED1 arranged at (e.g., in or on) the first area AR1 may be electrically connected to each other through an intermediate connection line MWL. The intermediate connection line MWL may be disposed on the second organic insulating layer OIL2. However, the present disclosure is not limited thereto. For example, the intermediate connection line MWL may be disposed on the first organic insulating layer OIL1 or the third organic insulating layer OIL3. The intermediate connection line MWL may extend from the second area AR2 to the first area AR1. The intermediate connection line MWL may be disposed at (e.g., in or on) the first area AR1 and the second area AR2.

In an embodiment, the intermediate connection line MWL may be electrically connected to the first pixel circuit PC1 arranged at (e.g., in or on) the second area AR2. Also, the intermediate connection line MWL may be electrically connected to the first organic light-emitting diode OLED1 arranged at (e.g., in or on) the first area AR1. In more detail, the intermediate connection line MWL may be electrically connected to the first pixel circuit PC1 through the first connection electrode CM1. In addition, the intermediate connection line MWL may be electrically connected to the first organic light-emitting diode OLED1 through the fourth intermediate connection electrode MCM4. As such, the first pixel circuit PC1 arranged at (e.g., in or on) the second area AR2 and the first organic light-emitting diode OLED1 arranged at (e.g., in or on) the first area AR1 may be electrically connected to each other.

In an embodiment, a first connection line CWL1 may be arranged at (e.g., in or on) the first area AR1. The first connection line CWL1 may be disposed on a first interlayer insulating layer 115. The first connection line CWL1 may be at (e.g., in or on) the same layer as and include the same material as those of the second semiconductor layer Act2.

The first connection line CWL1 may electrically connect the first organic light-emitting diodes OLED1 to each other. Two first organic light-emitting diodes OLED1 may be electrically connected to each other by one first connection line CWL1. In other words, two first pixel electrodes 211a may be electrically connected to each other by one first connection line CWL1. However, the present disclosure is not limited thereto. Two or more first organic light-emitting diodes OLED1 may be electrically connected to each other through one first connection line CWL1.

Because the first pixel circuit PC1 arranged at (e.g., in or on) the second area AR2 and one of the first organic light-emitting diodes OLED1 are electrically connected to each other, and because the one of the first organic light-emitting diodes OLED1 and another first organic light-emitting diode OLED1 are electrically connected to each other through the first connection line CWL1, two first organic light-emitting diodes OLED1 may be driven through one first pixel circuit PC1.

Figure 10:
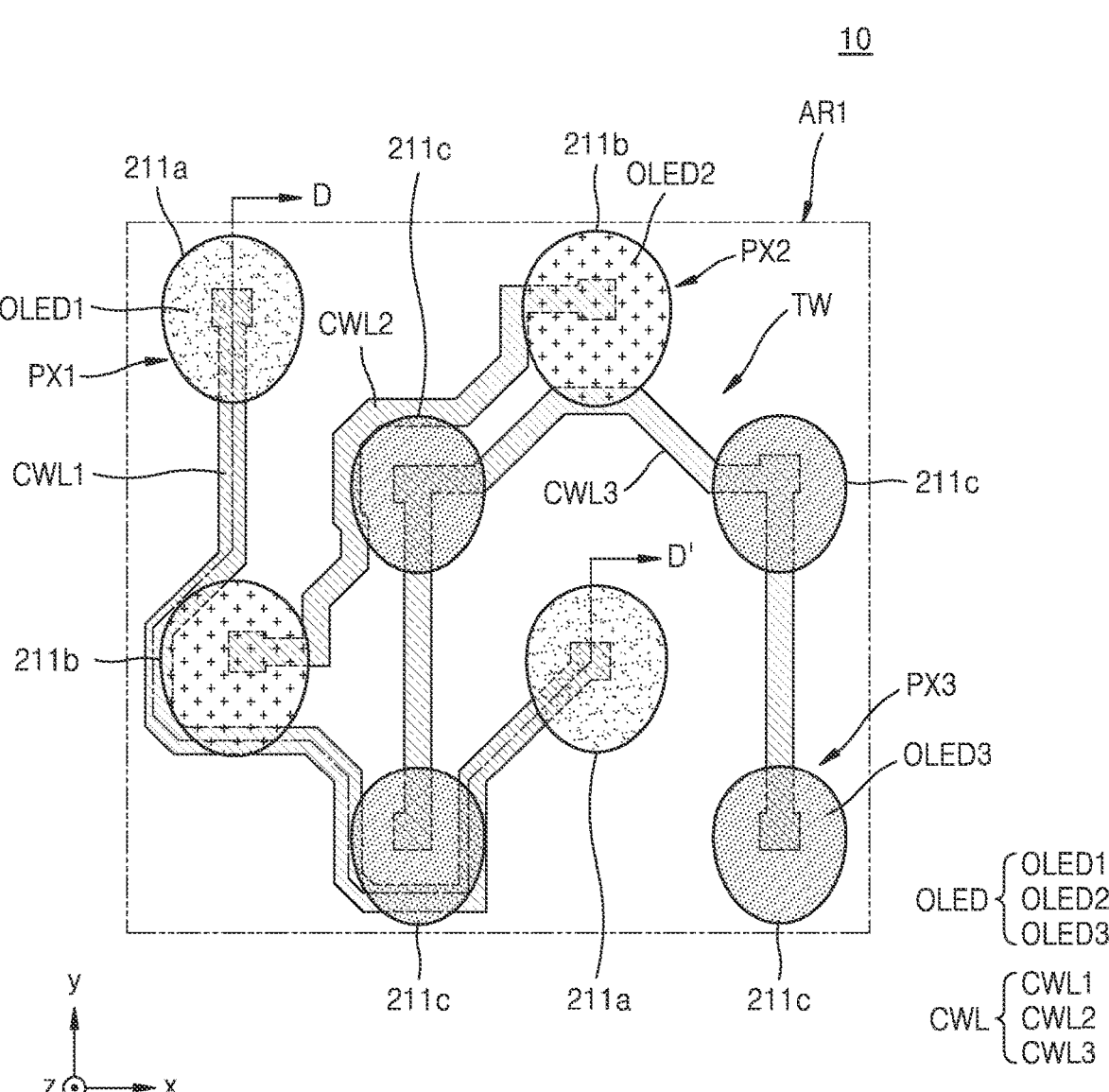
FIG. 10 is a schematic plan view illustrating a display panel according to an embodiment.
Figure 11:
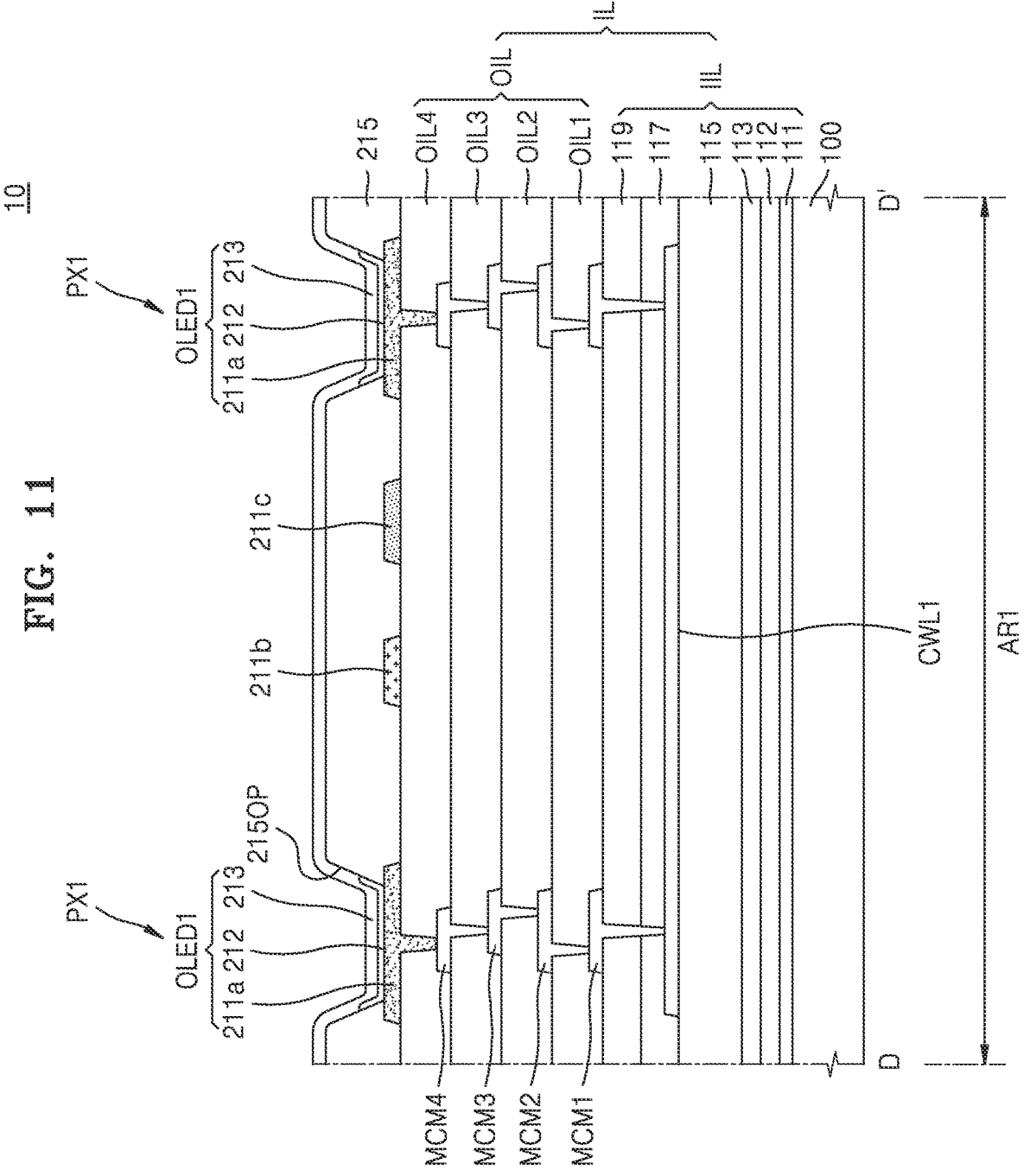
FIG. 11 is a schematic cross-sectional view illustrating a display panel according to an embodiment.

FIG. 10 is a schematic plan view illustrating a display panel 10 according to an embodiment. FIG. 11 is a schematic cross-sectional view illustrating a display panel 10 according to an embodiment. In more detail, FIG. 10 is a schematic plan view illustrating a portion of the first area AR1, and FIG. 11 is a schematic cross-sectional view of the display panel 10 of FIG. 10 taken along the line D-D' in FIG. 10.

Referring to FIGS. 10 and 11, the display panel 10 may include a substrate 100, an insulating layer IL, an organic light-emitting diode OLED as a display element, and a connection line CWL.

In an embodiment, the first area AR1 may include a transmissive area TW. In other words, the transmissive area TW may be defined at (e.g., in or on) the first area AR1. The transmissive area TW may be an area having a higher light transmittance than that of other areas of the first area AR1 excluding the transmissive area TW. The transmissive area TW may be an area where no conductive material or insulating layers are deposited to improve the light transmittance thereof. For example, the transmissive area TW may be an area where the connection line CWL and the pixel electrodes 211a, 211b, and 211c are not deposited.

The organic light-emitting diode OLED as the display element may be disposed on the substrate 100. A plurality of organic light-emitting diodes OLED may be provided. In an embodiment, the plurality of organic light-emitting diodes OLED may include a first organic light-emitting diode OLED1 as a first display element, a second organic light-emitting diode OLED2 as a second display element, and a third organic light-emitting diode OLED3 as a third display element. In an embodiment, each of the first organic light-emitting diode OLED1, the second organic light-emitting diode OLED2, and the third organic light-emitting diode OLED3 may be provided in a plurality.

In an embodiment, a plurality of display elements may implement a first pixel PX1, a second pixel PX2, and a third pixel PX3, which emit light of different wavelength bands from each other. As used in the present specification, a pixel refers to an emission area as a minimum unit for realizing an image. When an organic light-emitting diode is used as a display element, the emission area may be defined by an opening 2150P of a pixel-defining layer 215.

In an embodiment, the first organic light-emitting diode OLED1 as the first display element may implement the first pixel PX1. The second organic light-emitting diode OLED2 as the second display element may implement the second pixel PX2. The third organic light-emitting diode OLED3 as the third display element may implement the third pixel PX3.

In an embodiment, each of the first pixel PX1, the second pixel PX2, and the third pixel PX3 may emit one of red light, green light, or blue light. For example, the first pixel PX1, the second pixel PX2, and the third pixel PX3 may emit red light, blue light, and green light, respectively. As another example, the display panel 10 may further include a sub-pixel for emitting white light.

In an embodiment, the organic light-emitting diodes OLED may be arranged at (e.g., in or on) the first area AR1 as display elements. The organic light-emitting diodes OLED may include the first organic light-emitting diodes OLED1, the second organic light-emitting diodes OLED2, and the third organic light-emitting diodes OLED3. Accordingly, the first organic light-emitting diodes OLED1, the second organic light-emitting diodes OLED2, and the third organic light-emitting diodes OLED3 may be arranged at (e.g., in or on) the first area AR1. Each of the first organic light-emitting diodes OLED1 may include a first pixel electrode 211a, each of the second organic light-emitting diodes OLED2 may include a second pixel electrode 211b, and each of the third organic light-emitting diodes OLED3 may include a third pixel electrode 211c.

In an embodiment, each of the first to third pixels PX1, PX2, and PX3 arranged at (e.g., in or on) the first area AR1 may have an egg shape in an xy plan view. In other words, each of the first to third pixels PX1, PX2, and PX3 arranged at (e.g., in or on) the first area AR1 may have a distorted circular shape in the xy plan view. In other words, each of the first to third pixels PX1, PX2, and PX3 arranged at (e.g., in or on) the first area AR1 may have an oval shape in the xy plan view. However, the present disclosure is not limited thereto. Each of the first to third pixels PX1, PX2, and PX3 arranged at (e.g., in or on) the first area AR1 may have a circular shape, a quadrangular shape, a polygonal shape, or the like in the xy plan view.

As another example, because the first to third pixels PX1, PX2, and PX3 are implemented by the organic light-emitting diodes OLED, each of the organic light-emitting diodes OLED arranged at (e.g., in or on) the first area AR1 may have an egg shape in the xy plan view. In other words, each of the organic light-emitting diodes OLED arranged at (e.g., in or on) the first area AR1 may have a distorted circular shape in the xy plan view. In other words, each of the organic light-emitting diodes OLED arranged at (e.g., in or on) the first area AR1 may have an oval shape in the xy plan view. However, the present disclosure is not limited thereto. Each of the organic light-emitting diodes OLED arranged at (e.g., in or on) the first area AR1 may have a circular shape, a quadrangular shape, a polygonal shape, or the like in the xy plan view.

In this case, the shape of the organic light-emitting diode OLED may refer to the shape of the pixel electrode. Accordingly, each of the first to third pixel electrodes $211a$, $211b$, and $211c$ arranged at (e.g., in or on) the first area AR1 may have an egg shape in the xy plan view. In other words, each of the first to third pixel electrodes $211a$, $211b$, and $211c$ arranged at (e.g., in or on) the first area AR1 may have a distorted circular shape in the xy plan view. In other words, each of the first to third pixel electrodes $211a$, $211b$, and $211c$ arranged at (e.g., in or on) the first area AR1 may have an oval shape in the xy plan view. However, the present disclosure is not limited thereto. Each of the first to third pixel electrodes $211a$, $211b$, and $211c$ arranged at (e.g., in or on) the first area AR1 may have a circular shape, a quadrangular shape, a polygonal shape, or the like in the xy plan view.

As described above, the pixel circuit PC (e.g., see FIG. 3) may not be arranged at (e.g., in or on) the first area AR1. Accordingly, the organic light-emitting diodes OLED arranged at (e.g., in or on) the first area AR1 may be electrically connected, through an intermediate connection line MWL (e.g., see FIG. 3), to the first pixel circuit PC1 arranged at (e.g., in or on) the second area AR2.

In more detail, the first pixel circuit PC1 arranged at (e.g., in or on) the second area AR2 may be electrically connected to one first organic light-emitting diode OLED1 arranged at (e.g., in or on) the first area AR1 through the intermediate connection line MWL. The first pixel circuit PC1 arranged at (e.g., in or on) the second area AR2 may be electrically connected to one second organic light-emitting diode OLED2 arranged at (e.g., in or on) the first area AR1 through the intermediate connection line MWL. The first pixel circuit PC1 arranged at (e.g., in or on) the second area AR2 may be electrically connected to one third organic light-emitting diode OLED3 arranged at (e.g., in or on) the first area AR1 through the intermediate connection line MWL. In this case, the intermediate connection line MWL may be at (e.g., in or on) the same layer as and include the same material as those of the second connection electrode CM2 or the third connection electrode CM3 described above with reference to FIG. 8. Accordingly, light transmittance of the display panel 10 may increase in the first area AR1.

In an embodiment, a plurality of connection lines CWL may be arranged at (e.g., in or on) the first area AR1. The connection lines CWL may include a first connection line CWL1, a second connection line CWL2, and a third connection line CWL3.

In an embodiment, the connection lines CWL may electrically connect the organic light-emitting diodes OLED to one another. The first connection line CWL1 may electrically connect the first organic light-emitting diodes OLED1 to each other. Two first organic light-emitting diodes OLED1 may be electrically connected to each other by the first connection line CWL1. In other words, two first pixel electrodes $211a$ may be electrically connected to each other by the first connection line CWL1. The second connection line CWL2 may electrically connect the second organic light-emitting diodes OLED2 to each other. Two second organic light-emitting diodes OLED2 may be electrically connected to each other by the second connection line CWL2. In other words, two second pixel electrodes $211b$ may be electrically connected to each other by the second connection line CWL2. The third connection line CWL3 may electrically connect the third organic light-emitting diodes OLED3 to each other. Four third organic light-emitting diodes OLED3 may be electrically connected to each other by the third connection line CWL3. In other words, four third pixel electrodes $211c$ may be electrically connected to each other by the third connection line CWL3.

In an embodiment, the connection lines CWL arranged at (e.g., in or on) the first area AR1 may at least partially overlap with the organic light-emitting diodes OLED. The connection lines CWL arranged at (e.g., in or on) the first area AR1 may at least partially overlap with the first to third pixel electrodes $211a$, $211b$, and $211c$. In more detail, the first connection line CWL1 may at least partially overlap with the second pixel electrode $211b$ of the second organic light-emitting diode OLED2 and the third pixel electrode $211c$ of the third organic light-emitting diode OLED3. The second connection line CWL2 may at least partially overlap with the third pixel electrode $211c$ of the third organic light-emitting diode OLED3. Also, the third connection line CWL3 may at least partially overlap with the second pixel electrode $211b$ of the second organic light-emitting diode OLED2. As the connection lines CWL arranged at (e.g., in or on) the first area AR1 at least partially overlap with the pixel electrodes $211a$, $211b$, and $211c$ of the organic light emitting diodes OLED, an area of the transmissive area TW included in the first area AR1 may increase, and thus, light transmittance of the display panel 10 in the first area AR1 may be improved.

Referring to FIG. 11, the insulating layer IL, the first pixel electrode $211a$, the second pixel electrode $211b$, the third pixel electrode $211c$, the pixel-defining layer 215, the intermediate layer 212, and the opposite electrode 213 may be disposed on the substrate 100.

As described above with reference to FIG. 8, the insulating layer IL may include the inorganic insulating layer IIL and the organic insulating layer OIL. The inorganic insulating layer IIL may include the buffer layer 111, the first gate insulating layer 112, the second gate insulating layer 113, the first interlayer insulating layer 115, the third gate insulating layer 117, and the second interlayer insulating layer 119. The organic insulating layer OIL may include the first organic insulating layer OIL1, the second organic insulating layer OIL2, the third organic insulating layer OIL3, and the fourth organic insulating layer OIL4.

In an embodiment, the first connection line CWL1 may be disposed on the first interlayer insulating layer 115. The first connection line CWL1 may include an oxide semiconductor. For example, the first connection line CWL1 may include a Zn oxide-based material, and may include Zn oxide, In—Zn oxide, Ga—In—Zn oxide, or the like. As another example, the first connection line CWL1 may include IGZO, ITZO, or IGTZO semiconductor, in which suitable metals, such as In, Ga, and/or Sn, are contained in ZnO. The first connection line CWL1 may be at (e.g., in or on) the same layer as and include the same material as those of the second semiconductor layer Act2 described above with reference to FIG. 8.

In an embodiment, the first connection line CWL1, the second connection line CWL2, and the third connection line CWL3 may be provided at (e.g., in or on) the same layer as each other and may include the same material as each other. Because the first connection line CWL1 is provided at (e.g., in or on) the same layer as and includes the same material as those of the second semiconductor layer Act2, the second connection line CWL2 and the third connection line CWL3 may also be provided at (e.g., in or on) the same layer as and include the same material as those of the second semiconductor layer Act2.

By connecting the organic light-emitting diodes OLED to one another by using the connection lines CWL, which are provided at (e.g., in or on) the same layer as and include the same material as those of the second semiconductor layer Act2 arranged at (e.g., in or on) the third area AR3 (e.g., see FIG. 8), the number of masks used in a process of manufacturing the display device may be reduced. As such, the process of manufacturing the display device may be simplified. In addition, because the connection lines CWL arranged at (e.g., in or on) the first area AR1 include an oxide semiconductor having high light transmittance, the light transmittance of the first area AR1 may increase. By increasing the widths or thicknesses of the connection lines CWL, generation of a luminance difference between the sub-pixels due to resistivity may be prevented or reduced, even when the connection lines CWL include an oxide semiconductor.

A first intermediate connection electrode MCM1 may be disposed on the second interlayer insulating layer 119. A second intermediate connection electrode MCM2 may be disposed on the first organic insulating layer OIL1. A third intermediate connection electrode MCM3 may be disposed on the second organic insulating layer OIL2. A fourth intermediate connection electrode MCM4 may be disposed on the third organic insulating layer OIL3. The first pixel electrode 211a, the second pixel electrode 211b, and the third pixel electrode 211c may be disposed on the fourth organic insulating layer OIL4.

In an embodiment, the first pixel electrode 211a may be electrically connected to the first connection line CWL1. In this case, because a plurality of insulating layers are between the first pixel electrode 211a and the first connection line CWL1, the first pixel electrode 211a and the first connection line CWL1 are not electrically connected to each other through one contact hole, but may be electrically connected to each other through the first intermediate connection electrode MCM1, the second intermediate connection electrode MCM2, the third intermediate connection electrode MCM3, and the fourth intermediate connection electrode MCM4, which are located between the first pixel electrode 211a and the first connection line CWL1. For example, the first intermediate connection electrode MCM1 may be electrically connected to the first connection line CWL1 through contact holes defined in (e.g., penetrating) the third gate insulating layer 117 and the second interlayer insulating layer 119. The second intermediate connection electrode MCM2 may be electrically connected to the first intermediate connection electrode MCM1 through a contact hole defined in (e.g., penetrating) the first organic insulating layer OIL1. The third intermediate connection electrode MCM3 may be electrically connected to the second intermediate connection electrode MCM2 through a contact hole defined in (e.g., penetrating) the second organic insulating layer OIL2. The fourth intermediate connection electrode MCM4 may be electrically connected to the third intermediate connection electrode MCM3 through a contact hole defined in (e.g., penetrating) the third organic insulating layer OIL3. The first pixel electrode 211a may be electrically connected to the fourth intermediate connection electrode MCM4 through a contact hole defined in (e.g., penetrating) the fourth organic insulating layer OIL4. Accordingly, the first connection line CWL1 and the first pixel electrode 211a may be electrically connected to each other through the first intermediate connection electrode MCM1, the second intermediate connection electrode MCM2, the third intermediate connection electrode MCM3, and the fourth intermediate connection electrode MCM4. Although the connection between the first pixel electrode 211a and the first connection line CWL1 is mainly described with reference to FIG. 11, the second pixel electrode 211b and the second connection line CWL2 may be electrically connected to each other in the same or substantially the same (or similar) manner, and the third pixel electrode 211c and the third connection line CWL3 may also be electrically connected to each other in the same or substantially the same (or similar) manner, and thus, redundant description thereof may not be repeated.

An opening 2150P may be defined in the pixel-defining layer 215. At least a portion of the first pixel electrode 211a may be exposed through the opening 2150P defined in the pixel-defining layer 215. Also, an emission area of light emitted from the first organic light-emitting diode OLED1 may be defined by the opening 2150P.

In an embodiment, contact holes for connecting the first connection line CWL1 to the first pixel electrode 211a may overlap with the opening 2150P defined in the pixel-defining layer 215. In other words, the contact holes for connecting the first connection line CWL1 to the first pixel electrode 211a may be located below (e.g., underneath) the opening 2150P defined in the pixel-defining layer 215. As such, the area of the transmissive area TW included in the first area AR1 may be increased, and thus, the light transmittance of the display panel 10 in the first area AR1 may be improved.

As described above, the first connection line CWL1 may at least partially overlap with the second pixel electrode 211b and/or the third pixel electrode 211c. Also, the second connection line CWL2 may at least partially overlap with the third pixel electrode 211c. However, the present disclosure is not limited thereto. The second connection line CWL2 may at least partially overlap with the first pixel electrode 211a. The third connection line CWL3 may at least partially overlap with the second pixel electrode 211b. However, the present disclosure is not limited thereto. The third connection line CWL3 may at least partially overlap with the first pixel electrode 211a.

Figure 12:
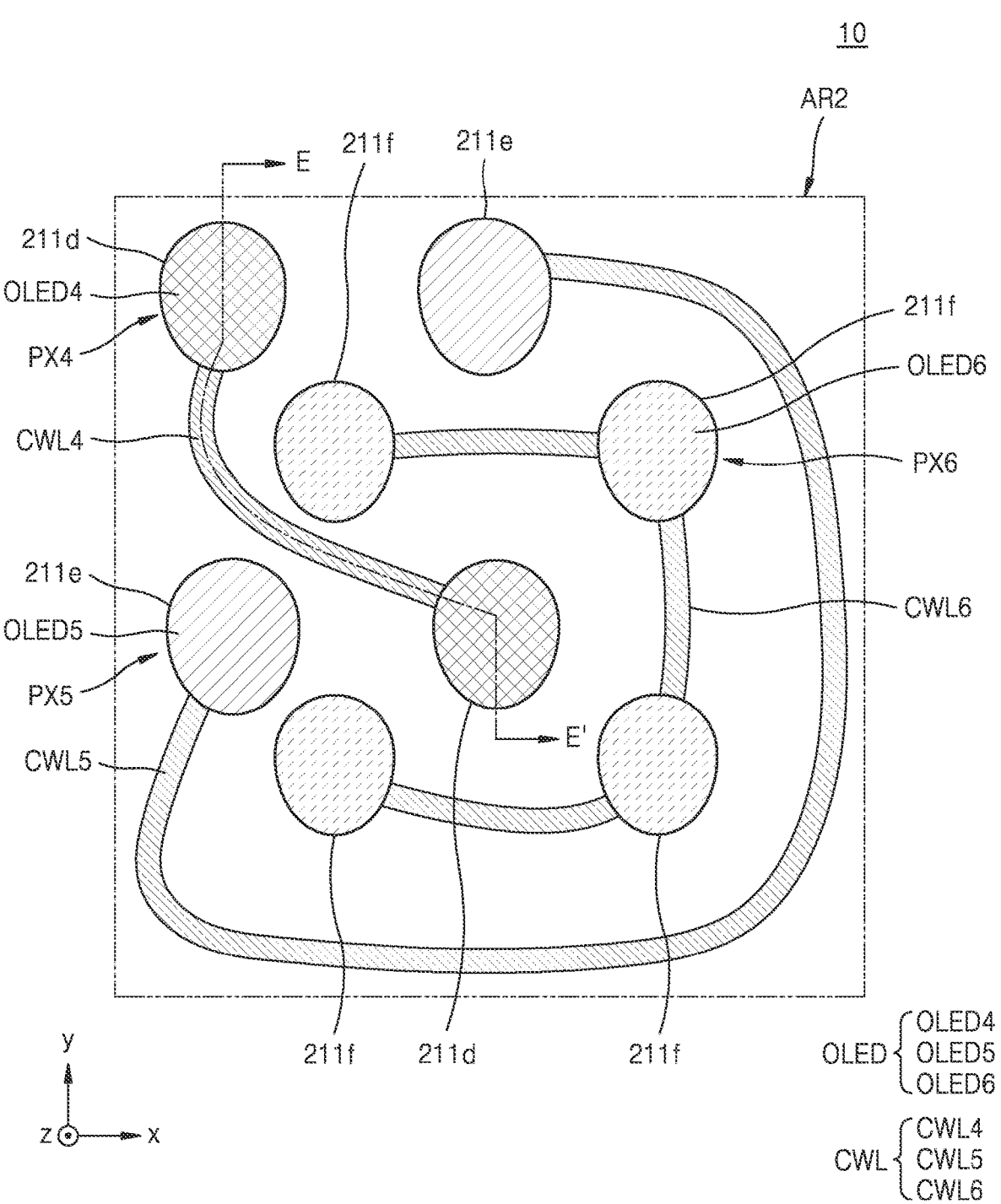
FIG. 12 is a schematic plan view illustrating a display panel according to an embodiment.
Figure 13:
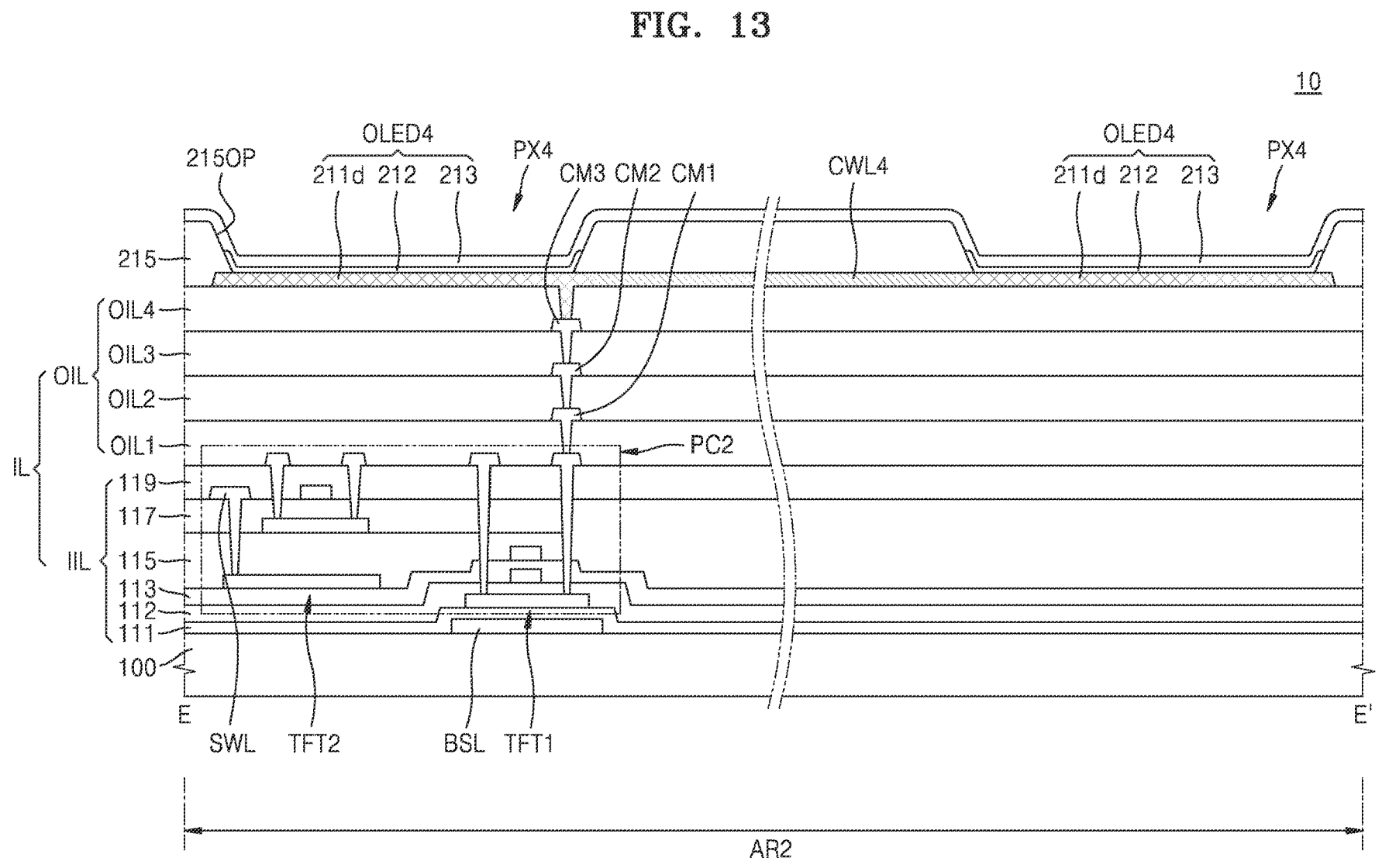

FIG. 12 is a schematic plan view illustrating a display panel 10 according to an embodiment. FIG. 13 is a schematic cross-sectional view illustrating a display panel 10 according to an embodiment. In more detail, FIG. 12 is a schematic plan view illustrating a portion of the second area AR2, and FIG. 13 is a schematic cross-sectional view illustrating the display panel 10 of FIG. 12 taken along the line E-E' in FIG. 12.

Referring to FIGS. 12 and 13, the display panel 10 may include the substrate 100, the insulating layer IL, the organic light-emitting diode OLED as a display element, and the connection line CWL.

The organic light-emitting diode OLED as the display element may be disposed on the substrate 100. A plurality of organic light-emitting diodes OLED may be provided. In an embodiment, the plurality of organic light-emitting diodes OLED may include a fourth organic light-emitting diode OLED4 as a fourth display element, a fifth organic light-emitting diode OLED5 as a fifth display element, and a sixth organic light-emitting diode OLED6 as a sixth display element. In an embodiment, each of the fourth organic light-emitting diode OLED4, the fifth organic light-emitting diode OLED5, and the sixth organic light-emitting diode OLED6 may be provided in a plurality.

In an embodiment, a plurality of display elements may implement a fourth pixel PX4, a fifth pixel PX5, and a sixth pixel PX6, which emit light of different wavelength bands from each other. As used in the present specification, a sub-pixel refers to an emission area as a minimum unit for realizing an image. When an organic light-emitting diode is used as the display element, the emission area may be defined by an opening 2150P of the pixel-defining layer 215.

In an embodiment, the fourth organic light-emitting diode OLED4 as the fourth display element may implement the fourth pixel PX4. The fifth organic light-emitting diode OLED5 as the fifth display element may implement the fifth pixel PX5. The sixth organic light-emitting diode OLED6 as the sixth display element may implement the sixth pixel PX6.

In an embodiment, each of the fourth pixel PX4, the fifth pixel PX5, and the sixth pixel PX6 may emit one of red light, green light, or blue light. For example, the fourth pixel PX4, the fifth pixel PX5, and the sixth pixel PX6 may emit red light, blue light, and green light, respectively. As another example, the display panel 10 may further include a sub-pixel for emitting white light.

In an embodiment, the organic light-emitting diodes OLED may be arranged at (e.g., in or on) the second area AR2 as the display elements. The organic light-emitting diodes OLED may include the fourth organic light-emitting diodes OLED4, the fifth organic light-emitting diodes OLED5, and the sixth organic light-emitting diodes OLED6. Accordingly, the fourth organic light-emitting diodes OLED4, the fifth organic light-emitting diodes OLED5, and the sixth organic light-emitting diodes OLED6 may be arranged at (e.g., in or on) the second area AR2. Each of the fourth organic light-emitting diodes OLED4 may include a fourth pixel electrode 211d, each of the fifth organic light-emitting diodes OLED5 may include a fifth pixel electrode 211e, and each of the sixth organic light-emitting diodes OLED6 may include a sixth pixel electrode 211f.

In an embodiment, each of the fourth to sixth pixels PX4, PX5, and PX6 arranged at (e.g., in or on) the second area AR2 in a xy plan view may have an egg shape. In other words, each of the fourth to sixth pixels PX4, PX5, and PX6 arranged at (e.g., in or on) the second area AR2 in the xy plan view may have a distorted circular shape. In other words, each of the fourth to sixth pixels PX4, PX5, and PX6 arranged at (e.g., in or on) the second area AR2 in the xy plan view may have an oval shape. However, the present disclosure is not limited thereto. Each of the fourth to sixth pixels PX4, PX5, and PX6 arranged at (e.g., in or on) the second area AR2 in the xy plan view may have a circular shape, a quadrangular shape, a polygonal shape, or the like.

As another example, because the fourth to sixth pixels PX4, PX5, and PX6 are implemented by the organic light-emitting diodes OLED, each of the organic light-emitting diodes OLED arranged at (e.g., in or on) the second area AR2 in the xy plan view may have an egg shape. In other words, each organic light-emitting diode OLED arranged at (e.g., in or on) the second area AR2 in the xy plan view may have a distorted circular shape. In other words, each of the organic light-emitting diodes OLED arranged at (e.g., in or on) the second area AR2 in the xy plan view may have an oval shape. However, the present disclosure is not limited thereto. Each of the organic light-emitting diodes OLED arranged at (e.g., in or on) the second area AR2 in the xy plan view may have a circular shape, a quadrangular shape, a polygonal shape, or the like.

In this case, the shape of the organic light-emitting diode OLED may refer to the shape of a pixel electrode. Accordingly, each of the fourth to sixth pixel electrodes 211d, 211e, and 211f arranged at (e.g., in or on) the second area AR2 in the xy plan view may have an egg shape. In other words, each of the fourth to sixth pixel electrodes 211d, 211e, and 211f arranged at (e.g., in or on) the second area AR2 in the xy plan view may have a distorted circular shape. In other words, each of the fourth to sixth pixel electrodes 211d, 211e, and 211f arranged at (e.g., in or on) the second area AR2 in the xy plan view may have an oval shape. However, the present disclosure is not limited thereto. Each of the fourth to sixth pixel electrodes 211d, 211e, and 211f arranged at (e.g., in or on) the second area AR2 in the xy plan view may have a circular shape, a quadrangular shape, a polygonal shape, or the like.

As described above with reference to FIG. 3, a plurality of organic light-emitting diodes OLED as a plurality of display elements may be electrically connected to one second pixel circuit PC2. In this case, the organic light-emitting diodes OLED may be electrically connected to each other through a connection line CWL.

In an embodiment, a plurality of connection lines CWL may be arranged at (e.g., in or on) the second area AR2. The connection lines CWL may include a fourth connection line CWL4, a fifth connection line CWL5, and a sixth connection line CWL6.

In an embodiment, the connection lines CWL may electrically connect the organic light-emitting diodes OLED to one another. The fourth connection line CWL4 may electrically connect the fourth organic light-emitting diodes OLED4 to each other. Two fourth organic light-emitting diodes OLED4 may be electrically connected to each other by the fourth connection line CWL4. In other words, two fourth pixel electrodes 211d may be electrically connected to each other by the fourth connection line CWL4. The fifth connection line CWL5 may electrically connect the fifth organic light-emitting diodes OLED5 to each other. Two fifth organic light-emitting diodes OLED5 may be electrically connected to each other by the fifth connection line CWL5. In other words, two fifth pixel electrodes 211e may be electrically connected to each other by the fifth connection line CWL5. The sixth connection line CWL6 may electrically connect the sixth organic light-emitting diodes OLED6 to each other. Four sixth organic light-emitting diodes OLED6 may be electrically connected to each other by the sixth connection line CWL6. In other words, four sixth pixel electrodes 211f may be electrically connected to each other by the sixth connection line CWL6.

Referring to FIG. 13, the insulating layer IL, the fourth pixel electrode 211d, the fifth pixel electrode 211e, the sixth pixel electrode 211f, the pixel-defining layer 215, the intermediate layer 212, and the opposite electrode 213 may be disposed on the substrate 100.

As described above with reference to FIG. 8, the insulating layer IL may include the inorganic insulating layer IIL and the organic insulating layer OIL. The inorganic insulating layer IIL may include the buffer layer 111, the first gate insulating layer 112, the second gate insulating layer 113, the first interlayer insulating layer 115, the third gate insulating layer 117, and the second interlayer insulating layer 119. The organic insulating layer OIL may include the first organic insulating layer OIL1, the second organic insulating layer OIL2, the third organic insulating layer OIL3, and the fourth organic insulating layer OIL4.

A second pixel circuit PC2 may be disposed on the substrate 100. Two fourth organic light-emitting diodes OLED4 may be driven through one second pixel circuit PC2. In this case, the second pixel circuit PC2 may overlap with one fourth organic light-emitting diode OLED4. However, the second pixel circuit PC2 may not overlap with the remaining fourth organic light-emitting diode OLED4. The second pixel circuit PC2 may be the same or substantially the same as (or similar to) the third pixel circuit PC3 described above with reference to FIG. 8, and thus, redundant description thereof may not be repeated. However, the present disclosure is not limited thereto. The second pixel circuit PC2 may be different (e.g., may have a different structure) from the third pixel circuit PC3.

The second pixel circuit PC2 may be electrically connected to the fourth organic light-emitting diode OLED4 through a first connection electrode CM1, a second connection electrode CM2, and a third connection electrode CM3 disposed on the first organic insulating layer OIL1, the second organic insulating layer OIL2, and the third organic insulating layer OIL3, respectively. In more detail, the second pixel circuit PC2 may be electrically connected to the fourth pixel electrode 211d of the fourth organic light-emitting diode OLED4 through the first connection electrode CM1, the second connection electrode CM2, and the third connection electrode CM3 disposed on the first organic insulating layer OIL1, the second organic insulating layer OIL2, and the third organic insulating layer OIL3, respectively. Accordingly, the second pixel circuit PC2 may drive the fourth organic light-emitting diode OLED4 disposed thereon.

The fourth pixel electrode 211d may be disposed on the fourth organic insulating layer OIL4. The pixel-defining layer 215 having the opening 2150P exposing at least a portion of the fourth pixel electrode 211d may be disposed on the fourth pixel electrode 211d. In addition, the intermediate layer 212 and the opposite electrode 213 may be disposed on the fourth pixel electrode 211d.

Also, the fourth connection line CWL4 may be disposed on the fourth organic insulating layer OIL4. In an embodiment, the fourth connection line CWL4 may be at (e.g., in or on) the same layer as and include the same material as those of the fourth pixel electrode 211d.

In an embodiment, the fourth connection line CWL4, the fifth connection line CWL5, and the sixth connection line CWL6 may be provided at (e.g., in or on) the same layer and include the same material as each other. Because the fourth connection line CWL4 is provided at (e.g., in or on) the same layer as and includes the same material as those of the fourth pixel electrode 211d, the fifth connection line CWL5 and the sixth connection line CWL6 may also be provided at (e.g., in or on) the same layer as and include the same material as those of the fourth pixel electrode 211d.

By connecting the organic light-emitting diodes OLED to one another by using the connection lines CWL, which are provided at (e.g., in or on) the same layer as and include the same material as those of the fourth pixel electrode 211d, the number of masks used in a process of manufacturing the display device may be reduced. As such, the process of manufacturing the display device may be simplified.

In an embodiment, the fourth connection line CWL4 may electrically connect the fourth pixel electrodes 211d to each other, which are spaced apart from each other. In other words, two fourth organic light-emitting diodes OLED4 may be electrically connected to each other through the fourth connection line CWL4. Because the fourth pixel electrode 211d and the fourth connection line CWL4 are provided at (e.g., in or on) the same layer and includes the same material as each other, and may be electrically connected to each other, the fourth pixel electrode 211d and the fourth connection line CWL4 may be integrally provided as one body. However, the present disclosure is not limited thereto. The fourth pixel electrode 211d and the fourth connection line CWL4 may be spaced apart from each other, and may be electrically connected to each other through a separate wiring line. Although the connection between the fourth pixel electrode 211d and the fourth connection line CWL4 is mainly described in more detail with reference to FIG. 13, the fifth pixel electrode 211e and the fifth connection line CWL5 may be electrically connected to each other in the same or substantially the same (or similar) manner, and the sixth pixel electrode 211f and the sixth connection line CWL6 may also be electrically connected to each other in the same or substantially the same (or similar) manner, and thus, redundant description thereof may not be repeated.

Figure 14:
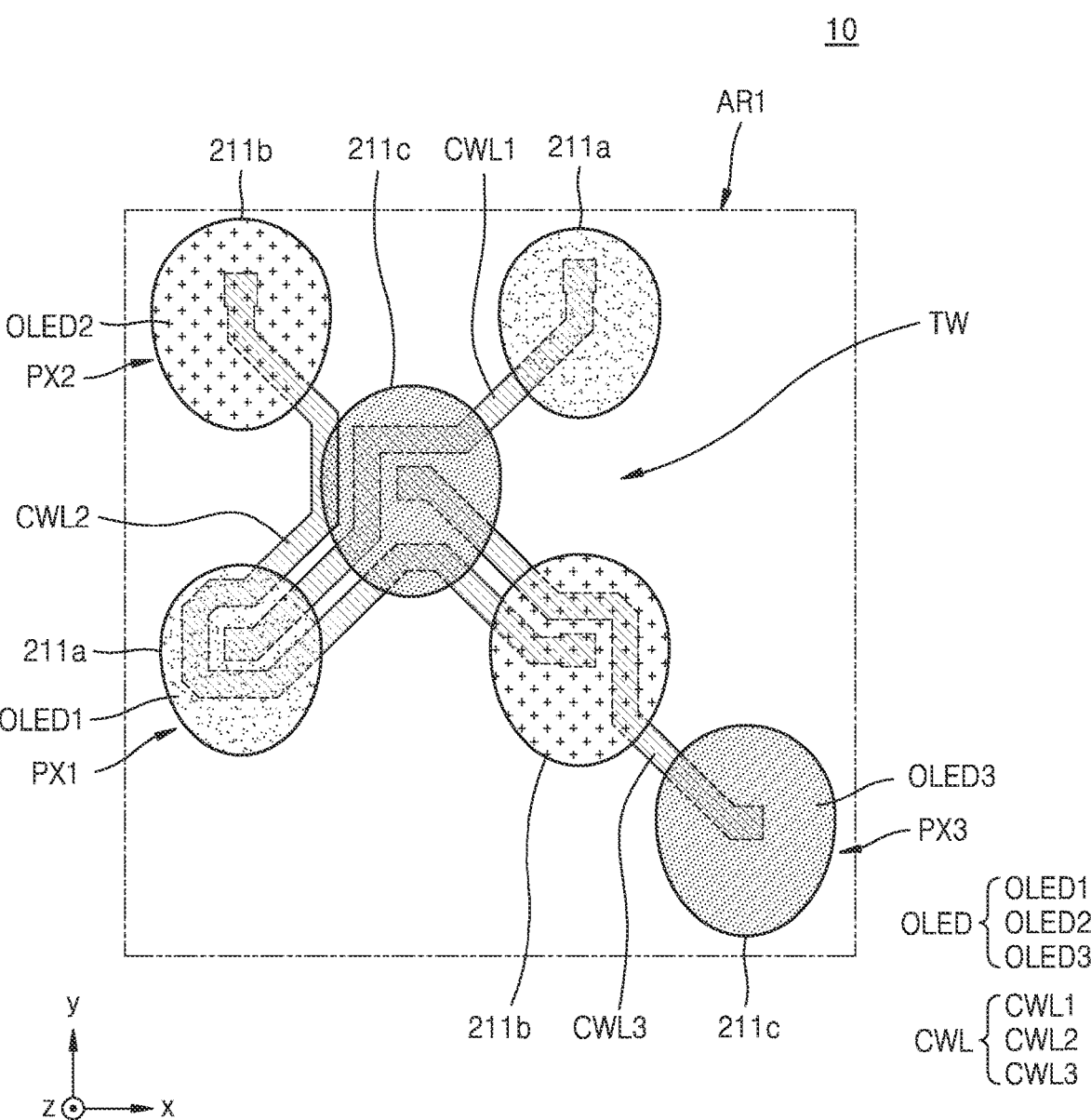
FIG. 14 is a schematic plan view illustrating a display panel according to an embodiment.

FIG. 14 is a schematic plan view illustrating a display panel 10 according to an embodiment. In more detail, FIG. 14 is a schematic plan view illustrating a portion of the first area AR1. In FIG. 14, the same reference numerals are used to denote the same or substantially the same members as those described above with reference to FIG. 10, and thus, redundant description thereof may not be repeated.

Referring to FIG. 14, the display panel 10 may include an organic light-emitting diode OLED as a display element, and a connection line CWL.

The organic light-emitting diode OLED as the display element may be disposed on the substrate 100. A plurality of organic light-emitting diodes OLED may be provided. In an embodiment, the plurality of organic light-emitting diodes OLED may include a first organic light-emitting diode OLED1 as a first display element, a second organic light-emitting diode OLED2 as a second display element, and a third organic light-emitting diode OLED3 as a third display element. In an embodiment, each of the first organic light-emitting diode OLED1, the second organic light-emitting diode OLED2, and the third organic light-emitting diode OLED3 may be provided in a plurality.

In an embodiment, the first organic light-emitting diode OLED1 as the first display element may implement a first pixel PX1. The second organic light-emitting diode OLED2 as the second display element may implement a second pixel PX2. The third organic light-emitting diode OLED3 as the third display element may implement a third pixel PX3.

In an embodiment, the organic light-emitting diodes OLED may be arranged at (e.g., in or on) the first area AR1 as the display elements. The organic light-emitting diodes OLED may include the first organic light-emitting diodes OLED1, the second organic light-emitting diodes OLED2, and the third organic light-emitting diodes OLED3. Accordingly, the first organic light-emitting diodes OLED1, the second organic light-emitting diodes OLED2, and the third organic light-emitting diodes OLED3 may be arranged at (e.g., in or on) the first area AR1. Each of the first organic light-emitting diodes OLED1 may include a first pixel electrode 211a, each of the second organic light-emitting diodes OLED2 may include a second pixel electrode 211b, and each of the third organic light-emitting diodes OLED3 may include a third pixel electrode 211c.

In an embodiment, a plurality of connection lines CWL may be disposed at (e.g., in or on) the first area AR1. The connection lines CWL may include a first connection line CWL1, a second connection line CWL2, and a third connection line CWL3.

In an embodiment, the connection lines CWL may electrically connect the organic light-emitting diodes OLED to one another. The first connection line CWL1 may electrically connect the first organic light-emitting diodes OLED1 to each other. Two first organic light-emitting diodes OLED1 may be electrically connected to each other by the first connection line CWL1. In other words, two first pixel electrodes 211*a* may be electrically connected to each other by the first connection line CWL1. The second connection line CWL2 may electrically connect the second organic light-emitting diodes OLED2 to each other. Two second organic light-emitting diodes OLED2 may be electrically connected to each other by the second connection line CWL2. In other words, two second pixel electrodes 211*b* may be electrically connected to each other by the second connection line CWL2. The third connection line CWL3 may electrically connect the third organic light-emitting diodes OLED3 to each other. Two third organic light-emitting diodes OLED3 may be electrically connected to each other by the third connection line CWL3. In other words, two third pixel electrodes 211*c* may be electrically connected to each other by the third connection line CWL3.

In an embodiment, the connection lines CWL arranged at (e.g., in or on) the first area AR1 may at least partially overlap with the organic light-emitting diodes OLED. The connection lines CWL arranged at (e.g., in or on) the first area AR1 may at least partially overlap with the pixel electrodes 211*a*, 211*b*, and 211*c*. For example, the first connection line CWL1 may at least partially overlap with the third pixel electrode 211*c* of the third organic light-emitting diode OLED3. The second connection line CWL2 may at least partially overlap with the first pixel electrode 211*a* of the first organic light-emitting diode OLED1 and the third pixel electrode 211*c* of the third organic light-emitting diode OLED3. Also, the third connection line CWL3 may at least partially overlap with the second pixel electrode 211*b* of the second organic light-emitting diode OLED2. However, the present disclosure is not limited thereto. The first connection line CWL1 may also at least partially overlap with the second pixel electrode 211*b* of the second organic light-emitting diode OLED2, and the third connection line CWL3 may also at least partially overlap with the first pixel electrode 211*a* of the first organic light-emitting diode OLED1.

As the connection lines CWL arranged at (e.g., in or on) the first area AR1 at least partially overlap with the pixel electrodes 211*a*, 211*b*, and 211*c* of the organic light emitting diodes OLED, an area of the transmissive area TW included in the first area AR1 may be increased, and thus, light transmittance of the display panel 10 in the first area AR1 may be improved.

In an embodiment, the overall shapes of the connection lines CWL in a xy plan view may be x-shaped. For example, in the xy plan view, the first connection line CWL1 may extend in a direction (e.g., a third direction), which is diagonal to a first direction (e.g., the +x direction) and a second direction (e.g., the +y direction) crossing the first direction (e.g., the +x direction). In the xy plan view, the third connection line CWL3 may extend in a fourth direction crossing the third direction as a whole. Also, in the xy plan view, portions of the second connection line CWL2 may extend in the third and fourth directions, respectively. Accordingly, the overall shapes of the first connection line CWL1, the second connection line CWL2, and the third connection line CWL3 may be x-shaped.

In an embodiment, at least a portion of the first connection line CWL1 and at least a portion of the second connection line CWL2 may be parallel to or substantially parallel to each other. For example, at least a portion of the first connection line CWL1 and at least a portion of the second connection line CWL2 may be parallel to or substantially parallel to each other in the second direction (e.g., the +y direction). Also, at least a portion of the first connection line CWL1 and at least a portion of the second connection line CWL2 may be parallel to or substantially parallel to each other in the third direction.

Also, at least a portion of the first connection line CWL1 and at least a portion of the third connection line CLW3 may be parallel to or substantially parallel to each other. For example, at least a portion of the first connection line CWL1 and at least a portion of the third connection line CLW3 may be parallel to or substantially parallel to each other in the fourth direction.

According to one or more embodiments of the present disclosure described above, a display device having improved transmittance may be provided, because the connection lines overlap with the pixel electrodes. However, the aspects and features of the present disclosure are not limited to those described above.

Although some embodiments have been described, those skilled in the art will readily appreciate that various modifications are possible in the embodiments without departing from the spirit and scope of the present disclosure. It will be understood that descriptions of features or aspects within each embodiment should typically be considered as available for other similar features or aspects in other embodiments, unless otherwise described. Thus, as would be apparent to one of ordinary skill in the art, features, characteristics, and/or elements described in connection with a particular embodiment may be used singly or in combination with features, characteristics, and/or elements described in connection with other embodiments unless otherwise specifically indicated. Therefore, it is to be understood that the foregoing is illustrative of various example embodiments and is not to be construed as limited to the specific embodiments disclosed herein, and that various modifications to the disclosed embodiments, as well as other example embodiments, are intended to be included within the spirit and scope of the present disclosure as defined in the appended claims, and their equivalents.

What is claimed is:

1. A display device comprising:
   a substrate comprising:
      a first area;
      a second area at least partially surrounding the first area; and
      a third area at least partially surrounding the second area;
   first display elements at the first area, each of the first display elements comprising a first pixel electrode;
   second display elements at the first area, each of the second display elements comprising a second pixel electrode;
   third display elements at the first area, each of the third display elements comprising a third pixel electrode; and
   a first connection line electrically connecting the first pixel electrode of the first display elements to each other,
   wherein the first connection line overlaps with at least a portion of the second pixel electrode, and at least a portion of the third pixel electrode, while being electrically insulated from the second pixel electrode and the third pixel electrode.

2. The display device of claim 1, further comprising a second connection line electrically connecting the second display elements to each other, wherein the second connection line overlaps with at least a portion of the first pixel electrode, and at least a portion of the third pixel electrode.

3. The display device of claim 2, further comprising a third connection line electrically connecting the third display elements to each other, wherein the third connection line overlaps with at least a portion of the first pixel electrode, and at least a portion of the second pixel electrode.

4. The display device of claim 3, wherein an overall shape of the first connection line, the second connection line, and the third connection line in a plan view is x-shaped.

5. The display device of claim 3, wherein at least a portion of the first connection line and at least a portion of the second connection line are parallel to each other.

6. The display device of claim 3, wherein at least a portion of the first connection line and at least a portion of the third connection line are parallel to each other.

7. The display device of claim 3, wherein the first connection line, the second connection line, and the third connection line are located at a same layer as each other.

8. The display device of claim 3, wherein the first connection line electrically connects two first display elements from among the first display elements to each other, and the second connection line electrically connects two second display elements from among the second display elements to each other.

9. The display device of claim 8, wherein the third connection line electrically connects two third display elements from among the third display elements to each other.

10. The display device of claim 8, wherein the third connection line electrically connects four third display elements from among the third display elements to each other.

11. The display device of claim 1, further comprising:
   fourth display elements at the second area, each of the fourth display elements comprising a fourth pixel electrode;
   fifth display elements at the second area, each of the fifth display elements comprising a fifth pixel electrode;
   sixth display elements at the second area, each of the sixth display elements comprising a sixth pixel electrode; and
   a fourth connection line electrically connecting the fourth display elements to each other.

12. The display device of claim 11, wherein the fourth connection line is located at a same layer as that of the fourth pixel electrode.

13. The display device of claim 11, further comprising:
   a first pixel circuit at the second area; and
   a second pixel circuit at the second area.

14. The display device of claim 13, wherein the first pixel electrode is electrically connected to the first pixel circuit.

15. A display device comprising:
   a substrate comprising:
      a first area;
      a second area at least partially surrounding the first area; and a third area at least partially surrounding the second area;
   first display elements at the first area, each of the first display elements comprising a first pixel electrode;
   second display elements at the first area, each of the second display elements comprising a second pixel electrode;
   third display elements at the first area, each of the third display elements comprising a third pixel electrode; and
   a first connection line electrically connecting the first display elements to each other,
   wherein the first connection line overlaps with at least a portion of the second pixel electrode, and at least a portion of the third pixel electrode,
   wherein the display device further comprises:
      fourth display elements at the second area, each of the fourth display elements comprising a fourth pixel electrode;
      fifth display elements at the second area, each of the fifth display elements comprising a fifth pixel electrode;
      sixth display elements at the second area, each of the sixth display elements comprising a sixth pixel electrode;
      a fourth connection line electrically connecting the fourth display elements to each other;
      a first pixel circuit at the second area; and
      a second pixel circuit at the second area, and
   wherein the fourth pixel electrode at least partially overlaps with the second pixel circuit.

16. The display device of claim 1, further comprising:
   a first thin-film transistor on the substrate, and comprising:
      a first semiconductor layer comprising a silicon semiconductor; and
      a first gate electrode at least partially overlapping with the first semiconductor layer;
   a first interlayer insulating layer covering the first thin-film transistor;
   a second thin-film transistor on the first interlayer insulating layer, and comprising:
      a second semiconductor layer comprising an oxide semiconductor; and
      a second gate electrode at least partially overlapping with the second semiconductor layer; and
   a second interlayer insulating layer covering the second thin-film transistor.

17. The display device of claim 16, wherein the first connection line comprises an oxide semiconductor.

18. The display device of claim 16, wherein the first connection line is located at a same layer as that of the second semiconductor layer.

19. The display device of claim 1, wherein the first area comprises a transmissive area.

20. The display device of claim 1, further comprising a component overlapping with the first area.

* * * * *